United States Patent
Yang et al.

(10) Patent No.: US 8,569,938 B2
(45) Date of Patent: Oct. 29, 2013

(54) TUNING FORK QUARTZ CRYSTAL RESONATOR INCLUDING RECESS ON BASE

(71) Applicant: Wafer MEMS Co., Ltd., Miaoli County (TW)

(72) Inventors: Chien-Cheng Yang, Hsinchu County (TW); Win-Yng Wang, Chiayi (TW); Hung-Peng Lee, Taichung (TW)

(73) Assignee: Wafer MEMS Co., Ltd., Miaoli County (TW)

( * ) Notice: Subject to any disclaimer, the term of this patent is extended or adjusted under 35 U.S.C. 154(b) by 0 days.

(21) Appl. No.: 13/769,606

(22) Filed: Feb. 18, 2013

(65) Prior Publication Data

US 2013/0154444 A1 Jun. 20, 2013

Related U.S. Application Data

(62) Division of application No. 12/789,652, filed on May 28, 2010, now Pat. No. 8,400,049.

(51) Int. Cl.
*H03H 9/19* (2006.01)

(52) U.S. Cl.
CPC ...................................... *H03H 9/19* (2013.01)
USPC ........................................................ 310/370

(58) Field of Classification Search
CPC .................................. H03H 9/21; H03H 9/215
USPC ........................................................ 310/370
See application file for complete search history.

(56) References Cited

U.S. PATENT DOCUMENTS

| 7,107,843 | B2 | 9/2006 | Ohuchi et al. |
| 7,176,604 | B2 | 2/2007 | Nakatani |
| 7,253,554 | B2 * | 8/2007 | Dalla Piazza et al. ........ 310/370 |
| 7,412,764 | B2 * | 8/2008 | Kawashima .................... 29/594 |
| 7,436,107 | B2 | 10/2008 | Aizawa et al. |
| 7,550,905 | B2 * | 6/2009 | Tanaya .......................... 310/370 |
| 7,626,318 | B2 | 12/2009 | Dalla Piazza et al. |
| 7,673,511 | B2 | 3/2010 | Yamamoto |

(Continued)

FOREIGN PATENT DOCUMENTS

| CN | 1652460 A | 8/2005 |
| JP | 2005151423 A | 6/2005 |

(Continued)

OTHER PUBLICATIONS

State Intellectual Property Office of the People's Republic of China, "Office Action", Nov. 28, 2012, China.

*Primary Examiner* — Jaydi San Martin
(74) *Attorney, Agent, or Firm* — Morris Manning & Martin LLP; Tim Tingkang Xia, Esq.

(57) ABSTRACT

A tuning fork quartz crystal resonator includes a base, a first resonating arm, and a second resonating arm. The base has a generally planar fifth main surface and a generally planar sixth main surface opposite to each other, and has a fifth side surface and a sixth side surface opposite to each other. The first resonating arm is connecting to one side of the base. The second resonating arm is connecting to the same side of the base. A recess is formed on the fifth main surface, and the recess is sized and configured such that a first width near the first resonating arm and the second resonating arm is greater than a second width away from the first resonating arm and the second resonating arm.

2 Claims, 26 Drawing Sheets

(56) References Cited

U.S. PATENT DOCUMENTS

| | | | |
|---|---|---|---|
| 7,863,804 B2 * | 1/2011 | Tanaya | 310/370 |
| 8,446,079 B2 * | 5/2013 | Fang et al. | 310/370 |
| 2001/0054860 A1 * | 12/2001 | Knowles | 310/370 |
| 2004/0132310 A1 | 7/2004 | Nakatani et al. | |
| 2007/0024163 A1 * | 2/2007 | Tanaya | 310/370 |
| 2007/0188055 A1 * | 8/2007 | Kuwahara | 310/370 |
| 2009/0051252 A1 * | 2/2009 | Shirai | 310/348 |
| 2009/0289531 A1 | 11/2009 | Fang et al. | |

FOREIGN PATENT DOCUMENTS

| | | |
|---|---|---|
| JP | 2006217603 A | 8/2006 |
| JP | 2006262289 A | 9/2006 |
| JP | 2009027711 A | 2/2009 |
| JP | 2010193482 A | 9/2010 |
| JP | 2011045119 A | 3/2011 |

* cited by examiner

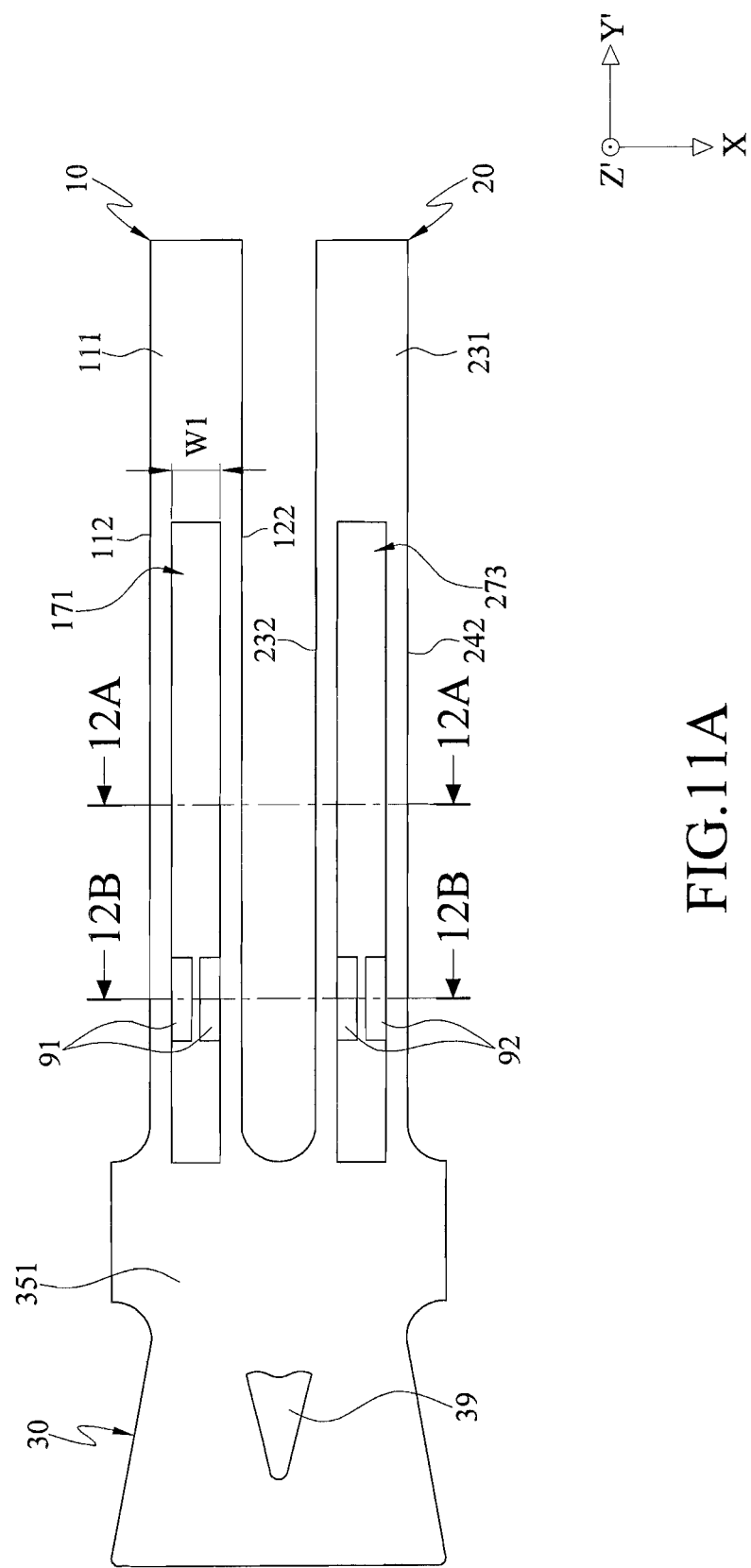

TUNING FORK QUARTZ CRYSTAL RESONATOR INCLUDING RECESS ON BASE

CROSS-REFERENCE TO RELATED APPLICATIONS

This is a divisional patent application of U.S. patent application Ser. No. 12/789,652, filed on May 28, 2010, entitled "TUNING FORK QUARTZ CRYSTAL RESONATOR" by Chien Cheng Yang et. al., which itself claims priority under 35 U.S.C. §119(a) on Patent Application No. 098139231 filed in Taiwan, R.O.C. on Nov. 18, 2009, the entire contents of which are hereby incorporated by reference.

BACKGROUND

1. Field of the Invention

The present invention relates to a piezoelectric resonator, particularly to a tuning fork quartz crystal resonator.

2. Related Art

A quartz crystal resonator uses its piezoelectric characteristics to generate a periodic constant frequency. It retains a relative high Quality Factor (Q value) to maintain a stable frequency. It has been provided to frequency and timing control for various portable devices such as watches, cell phones, global position system, wireless communications, and medical devices, etc.

FIG. 15 depicts the electric equivalent circuit of the quartz crystal resonator. In FIG. 15, a motional resistance (R1), a motional inductance (L1), and a motional capacitance (C1) form a series arm. This series arm is then connected to a static capacitance (C0) in parallel.

Based on the electric equivalent circuit shown in FIG. 15, the series resonate frequency (Fs) is defined as follows:

$$Fs = \frac{1}{2\pi\sqrt{L_1 C_1}}$$

A tuning fork quartz crystal resonator has the same electric equivalent circuit. A tuning fork quartz crystal resonator is manufactured from a quartz wafer that was cut from a single crystal alpha quartz bar with a designate cutting angle θ. After the resonator was processed and shaped into a tuning fork structure of the desired dimension, two electrodes of opposite polarities are formed on the resonating arms with proper electrical connection paths. By inserting a tuning fork quartz crystal resonator into an oscillation circuit, it induces the resonator to vibrate in flexure mode at constant oscillating frequency.

FIG. 14 illustrates the X, Y, and Z coordinate for a single crystal alpha quartz bar, and the X, Y', and Z' coordinate for a quartz wafer with a designate cutting angle θ. The tuning fork crystal resonator and the quartz wafer have the same X, Y', and Z' coordinates. The cutting angle θ is an angle rotating around the +X axis in a range of −6° to +6°. The X axis is interpreted as an electrical axis, the Y axis is a mechanical axis, and the Z axis is an optical axis.

The resonating frequency (Fs) of the tuning fork quartz crystal resonator is proportional to the width (W) of the resonating arm, and inversely proportional to the square of the length (L) of the resonating arm. The relation of the resonating frequency, resonating arm length, and width is as follow:

$$Fs = k \times \frac{W}{L^2}$$

where k is a constant

An oscillator consists of a tuning fork quartz crystal resonator and an oscillation circuit. In general, an oscillator has a better performance when the resonator has a lower R1 value.

The electronic industry has been growing for last thirty years. On demand, most electronic devices and components have been miniaturized. A tuning fork quartz crystal resonator can be miniaturized by reducing the length and width of the resonating arms. In general, reducing the length and width of the resonating arms results in a lower C1 value and higher R1 value.

SUMMARY

In order to reduce the R1 value, a quartz crystal resonator can be designed to increase the C1 value without degrading the Q value. An effective way to increase the C1 value of a tuning fork resonator is to strengthen the electrical field along the X axis between two electrodes on the resonating arms.

Photolithographic etching process has been used to miniaturize the quartz crystal resonator. To increase the C1 value of a tuning fork resonator, the concept of symmetric grooves on the upper and lower main surfaces of the two resonating arms was introduced in early Nineteen Eighty. To form symmetric grooves and tuning fork structure requires multiple photolithographic etching processes.

The present invention provides a different approach to the conventional one in the groove design. "Asymmetric grooves" are formed to a desirable range of depth on the upper and lower main surfaces of the two resonating arms of the tuning fork quartz crystal resonator by a photolithographic etching process. The tuning fork structure and the asymmetric grooves can be formed simultaneously in one single etching process. Followed by the metal coating process, one electrode is formed on both side surfaces of the resonating arms, and the other electrode with opposite polarity is formed in the grooves. With proper electrical connection of the two electrodes between the grooves and the side surfaces of the resonating arms, the effective electrical field strength on the resonating arms along the X axis is increased which leads to a higher C1 value and a lower R1 value. This invention fully utilizes the physical characteristics of the asymmetric grooves, simplifies the photolithographic etching process, shortens the manufacturing cycle time, reduces the manufacturing cost, and improves the production capacity.

Furthermore, the present invention also provides an unique structure on the base of the tuning fork resonator by adding a recess to the base, and a continuous curved concave to both side surfaces of the base. This unique structure can reduce the ultrasonic energy from being propagated through the base mounting pads to the ceramic package. The Q value of the resonator is thus retained to ensure the high performance of the resonator.

The present invention proposes a tuning fork quartz crystal resonator, particularly a miniaturized tuning fork quartz crystal resonator. This tuning fork quartz crystal resonator is produced from quartz wafer. During the same photolithographic etching process, the asymmetric grooves on the resonating arms and the shape of the turning forks are formed simultaneously. Metal films are deposited on the side surfaces and in the grooves of the resonating arms to form two electrodes of opposite polarities. With proper electrical connection between the two electrodes, a miniature tuning fork resonator with low R1 value can be produced. The frequency of the resonator is in a range of 10 KHz to 200 KHz.

FIG. 1A is a schematic three-dimensional view of the present invention, and FIG. 1B is a schematic three-dimensional back view of FIG. 1A. The tuning fork quartz crystal resonator of the present invention comprises a first resonating arm, a second resonating arm, and a base. The first resonating arm and the second resonating arm are connected to same side of the base.

The first resonating arm has a first main surface, a first side surface, a second main surface, and a second side surface adjacent to each other in sequence. The first resonating arm has at least one first groove and at least one second groove. The first groove is located on the first main surface, and the second groove is located on the second main surface. The first resonating arm has at least one first via-hole. The first via-hole extends from the first main surface to the second main surface.

The second resonating arm has a third main surface, a third side surface, a fourth main surface, and a fourth side surface adjacent to each other in sequence. The second resonating arm has at least one third groove and at least one fourth groove. The third groove is located on the third main surface, and the fourth groove is located on the fourth main surface. The second resonating arm has at least one second via-hole. The second via-hole extends from the third main surface to the fourth main surface.

The base has a fifth main surface and a sixth main surface opposite to each other. The base also has a fifth side surface and a sixth side surface opposite to each other. The fifth side surface and the sixth side surface of the base have a concave, and the concave is a continuous curved surface. There is a recess on the fifth main surface or the sixth main surface of the base.

The present invention has an unique asymmetric grooves design. The asymmetric grooves are formed on the first main surface and the second main surface on the opposite side of the first resonating arm, as well as the third main surface and the fourth main surface on the opposite side of the second resonating arm. In other words, the first and the third groove are asymmetric to the second and the fourth groove. Both the first and the third groove have a first depth, and the second and the fourth groove have a second depth. The first depth and the second depth are substantially different from each other. The characteristics of the asymmetric grooves can be asymmetric in groove number, depth, or width.

This invention addresses various asymmetric groove designs. The groove designs can be asymmetric in groove number, groove width, or groove depth. For example, the asymmetric grooves can be on the first and the third main surface where there are two first groove and two third groove respectively, and on the second main surface and the fourth main surface where there are two second groove and two fourth groove respectively. In other case, they can be on the first main surface and the third main surface where there are two first groove and two third groove respectively, and on the second main surface and the fourth main surface where there is one second groove and one fourth groove respectively. In other case, they can be on the first main surface and the third main surface where there is one first groove and one third groove respectively, and on the second main surface and the fourth main surface where there are two second groove and two fourth groove respectively.

Refer to FIGS. 2A and 2B. FIG. 2A is a schematic view of the electrodes and electrical interconnection patterns of FIG. 1A, and FIG. 2B is a schematic view of the electrodes and electrical interconnection patterns of FIG. 1B. The first main surface and the third main surface are located on the same plane. A thin metal layer is deposited on the surface of the first groove, the surface of the second groove, the surface of the first via-hole, the third side surface, and the fourth side surface. A thin metal layer is also deposited on the surface of the third groove, the surface of the fourth groove, the surface of the second via-hole, the first side surface, and the second side surface. The metal film on the surface of the first groove, the metal film on the surface of the second groove, the metal film on the surface of the first via-hole, the metal film on the third side surface, and the metal film on the fourth side surface are electrically connected to form a first electrode. This first electrode extends to the bottom of the base through a first conducting path on the main surface of the base. The metal film on the surface of the third groove, the metal film on the surface of the fourth groove, the metal film on the surface of the second via-hole, the metal film on the first side surface, and the metal film on the second side surface are electrically connected to form a second electrode. This second electrode extends to the bottom of the base through a second conducting path on the main surfaces of the base. The first electrode and the second electrode have opposite polarities.

The shape of the first via-hole and the second via-hole of the present invention is not limited to a rectangle. It can be square, round, or elliptic. The size, shape, position, number, and penetrating manner of the first and the second via-hole may be designed in various ways in accordance with the numbers and structures of the first groove, the second groove, the third groove, and the fourth groove.

The performance of the resonator is effectively improved by implementing the asymmetric grooves on the resonating arms, the via-holes connecting the grooves, the continuous curved surfaces concaves on the side surfaces of the base, and the recess on the main surface of the base. In addition, using the principles of these characteristics, the manufacturing process of the tuning fork quartz crystal resonator is greatly simplified, and the manufacturing cost is lowered.

A manufacturing process of the present invention is described as follows:

Step A, a quartz wafer is produced from a single crystal alpha quartz bar cut at a designate angle ($\theta$).

Step B, a metal layer is deposited on the upper and lower surfaces of the wafer.

Step C, a first photo resist layer is coated on the metal layers of the upper and lower surfaces of the wafer. Followed by the exposure and development process, some specific areas of the first photo resist layer are removed to expose the metal surfaces underneath. In other words, the first photo resist layer only remains on the main body of the tuning fork which comprises the base, the first resonating arm, and the second resonating arm of the resonator, but excluding the asymmetric grooves and the via-holes on the resonating arms, and the recess on the base.

Step D, these exposed metal films are removed by metal etching process.

Step E, the remaining first photo resist layer is then removed from the wafer.

Step F, a second photo resist layer is coated on the top and bottom surfaces of the wafer. Some specific areas of the second photo resist layer are removed by the exposure and development process. The remaining second photo resist layer only covers the main body of the tuning fork which comprises the base, the first and the second resonating arm, but excluding the asymmetric grooves and the via-holes of the resonating arms, the recess of the base, and the non-electrode areas on the main surfaces of the resonating arms and the base. In other words, the second photo resist layer was partly removed to expose the asymmetric grooves and the via-holes of the resonating arms, the recess of the base, the non-electrode areas on the main surfaces of the resonating arms and the base, and the regions of surfaces other than the main bodies of the tuning forks.

Step G, the wafer is placed in a quartz etching bath. The quartz surfaces without the metal films covered will be etched to form the tuning fork structure. In the same quartz etching process step, due to the unique asymmetric groove design, not only the tuning fork structure is formed, but also the desirable depths of the asymmetric grooves and via-holes on the resonating arms, and the recess of the base are successfully constructed.

Step H, a metal etching process is performed on the wafer to remove the metal surface not covered by the second photo resist layer, and therefore expose the quartz surface underneath. The purpose of this step is to form the electrode pattern, including the first electrode, the second electrode, and the necessary electrode connecting paths on the main surfaces of the resonating arms and the base.

Step I, the remaining second photo resist layer is removed. At this time, the first electrode and the second electrode of the resonator are partially formed.

Step J, a metal layer is deposited onto the asymmetric grooves, the via-holes, and the side surfaces of the resonating arms. This metal layer is formed to complete the electrodes of the tuning fork resonator.

The above describes the designs, the manufacturing method, and process of the present invention.

BRIEF DESCRIPTION OF THE DRAWINGS

The present invention will become more fully understood from the detailed description given herein below for illustration only, and thus are not limitative of the present invention, and wherein:

FIG. 11A is a top view of a third embodiment of the present invention;

DETAILED DESCRIPTION

The features and advantages of the present invention are described in the following detailed embodiments. This allows relative skilled persons understand and implement the content of the present invention. Furthermore, by reference to the contents of the disclosed specification, claims, and drawings, they can easily comprehend the objective and advantage of the present invention. The embodiments below are intended to further describe the views of the present invention but not to limit the scope of the same.

First Embodiment

Figure 1A:
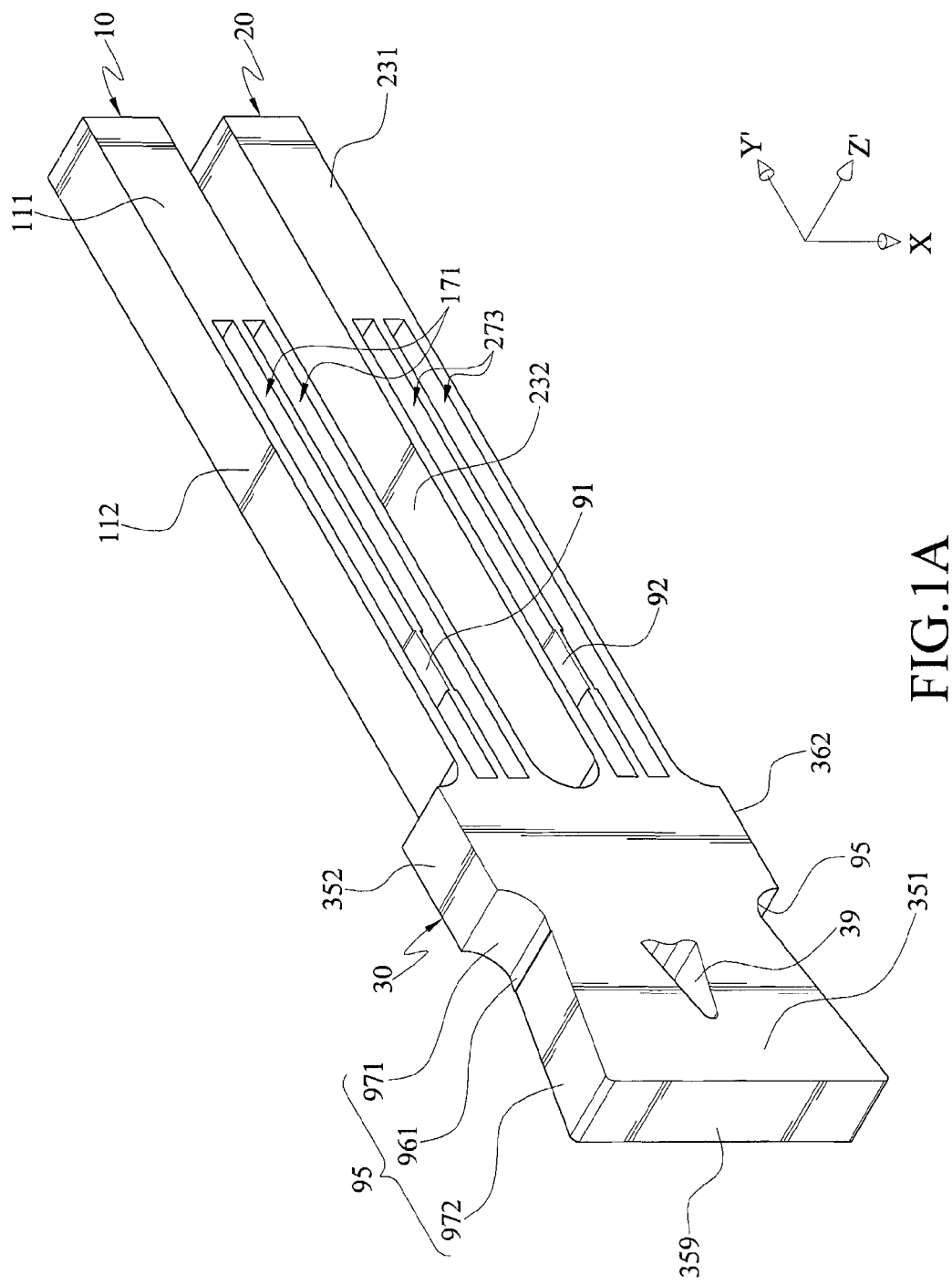
FIG. 1A is a schematic three-dimensional front view of the present invention.
Figure 1B:
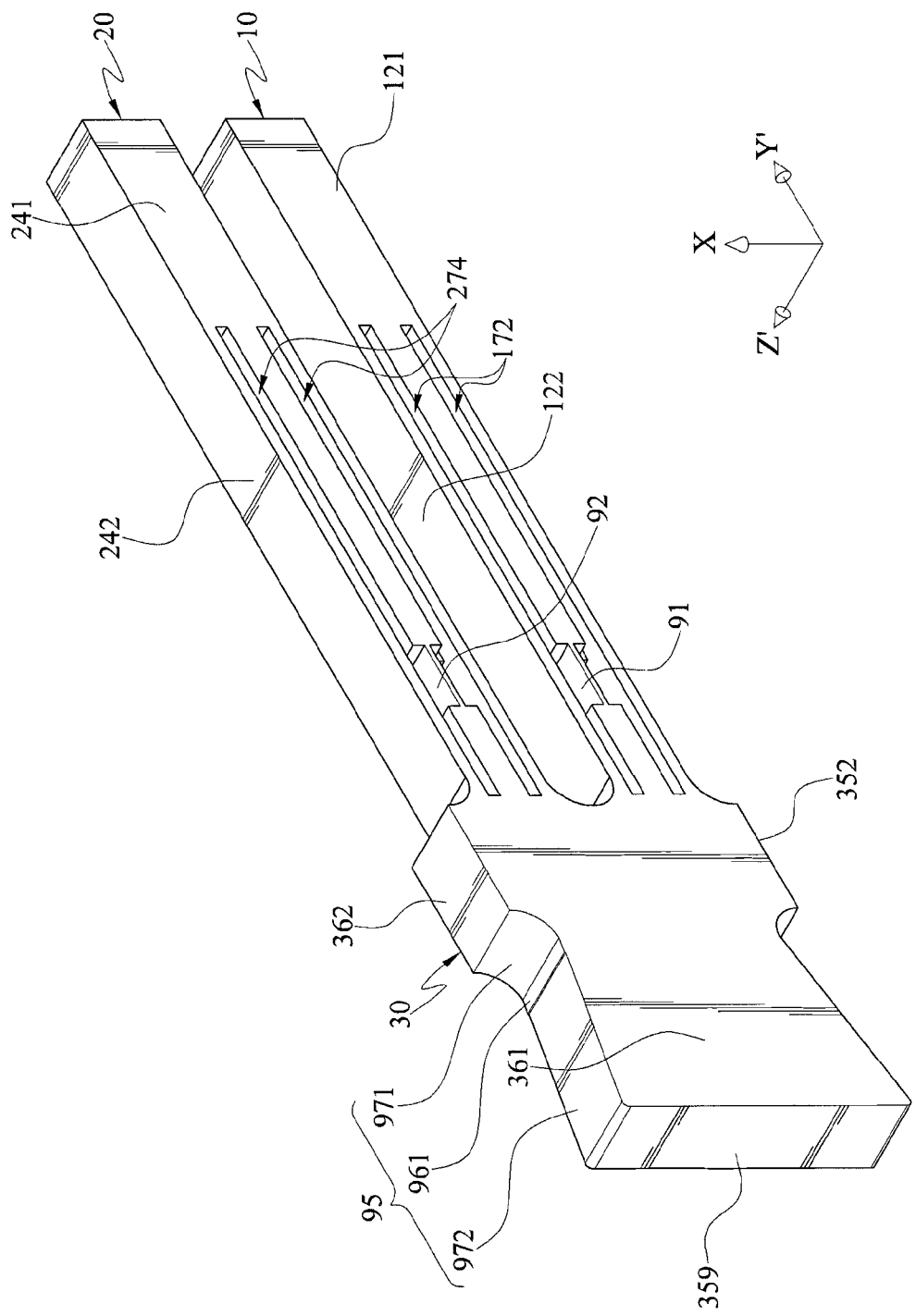
FIG. 1B is a schematic three-dimensional back view of the present invention.
Figure 2A:
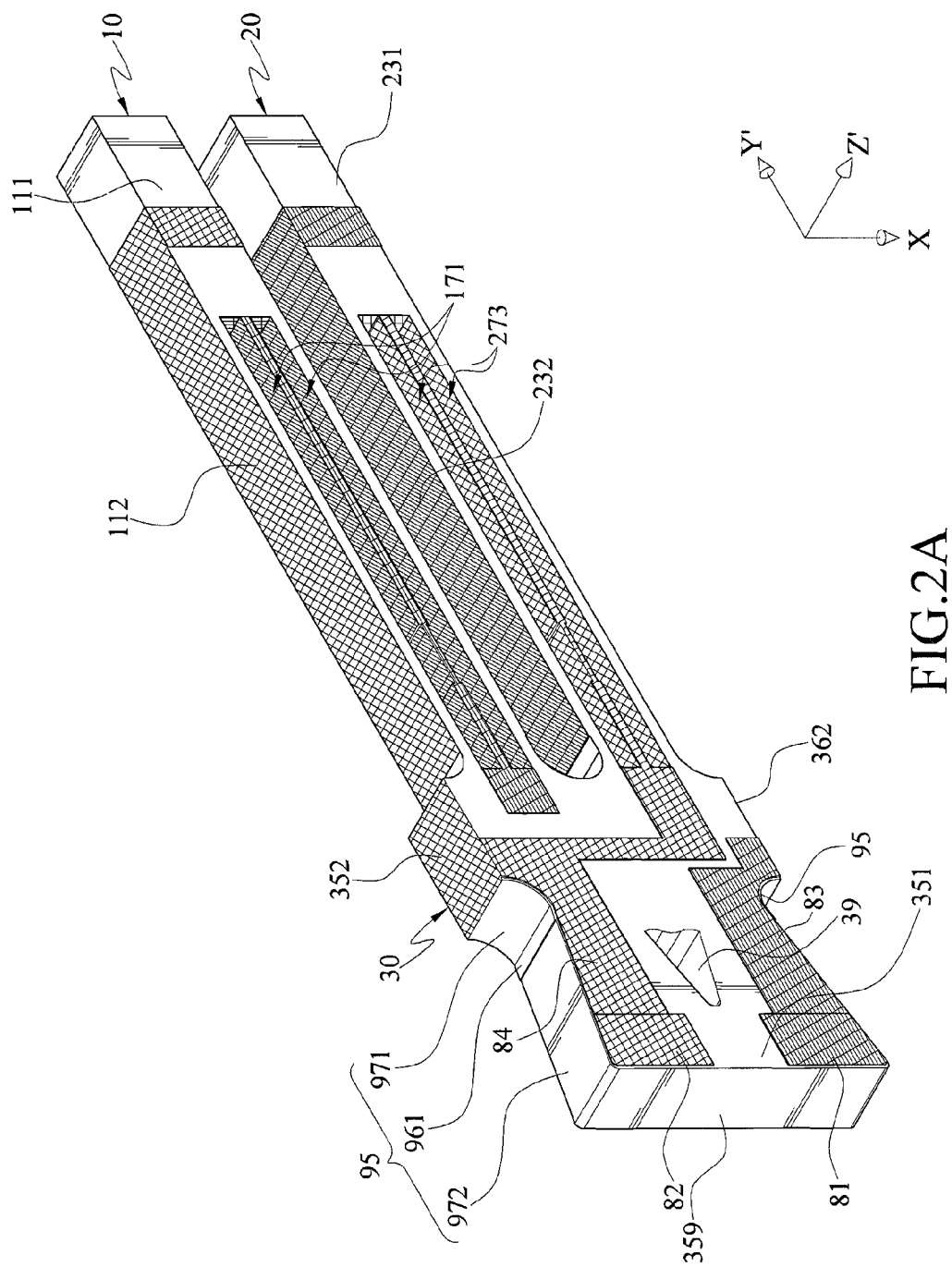
FIG. 2A is a schematic view of an electrical connection relation of FIG. 1A.
Figure 2B:
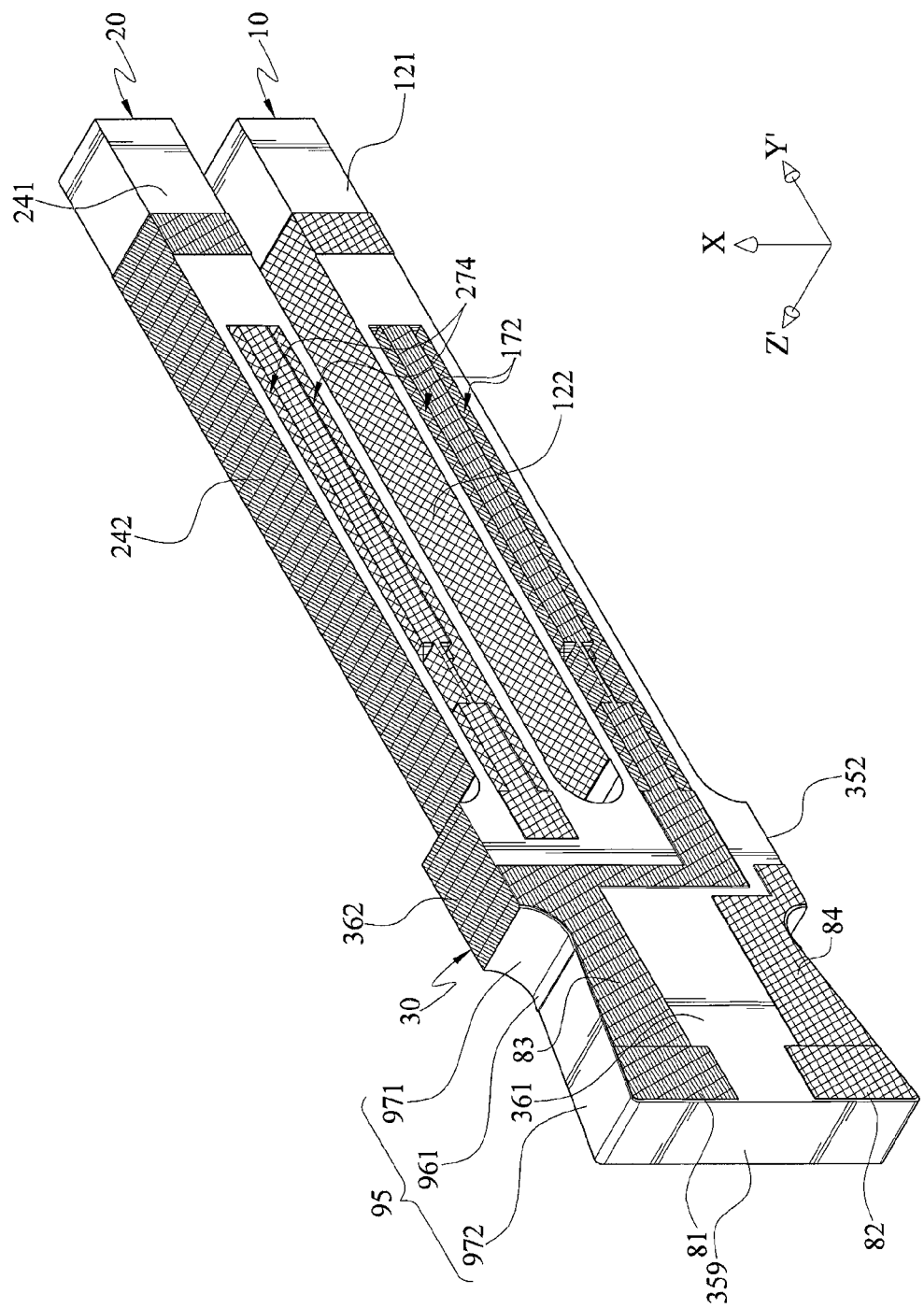
FIG. 2B is a schematic view of an electrical connection relation of FIG. 1B.
Figure 3A:
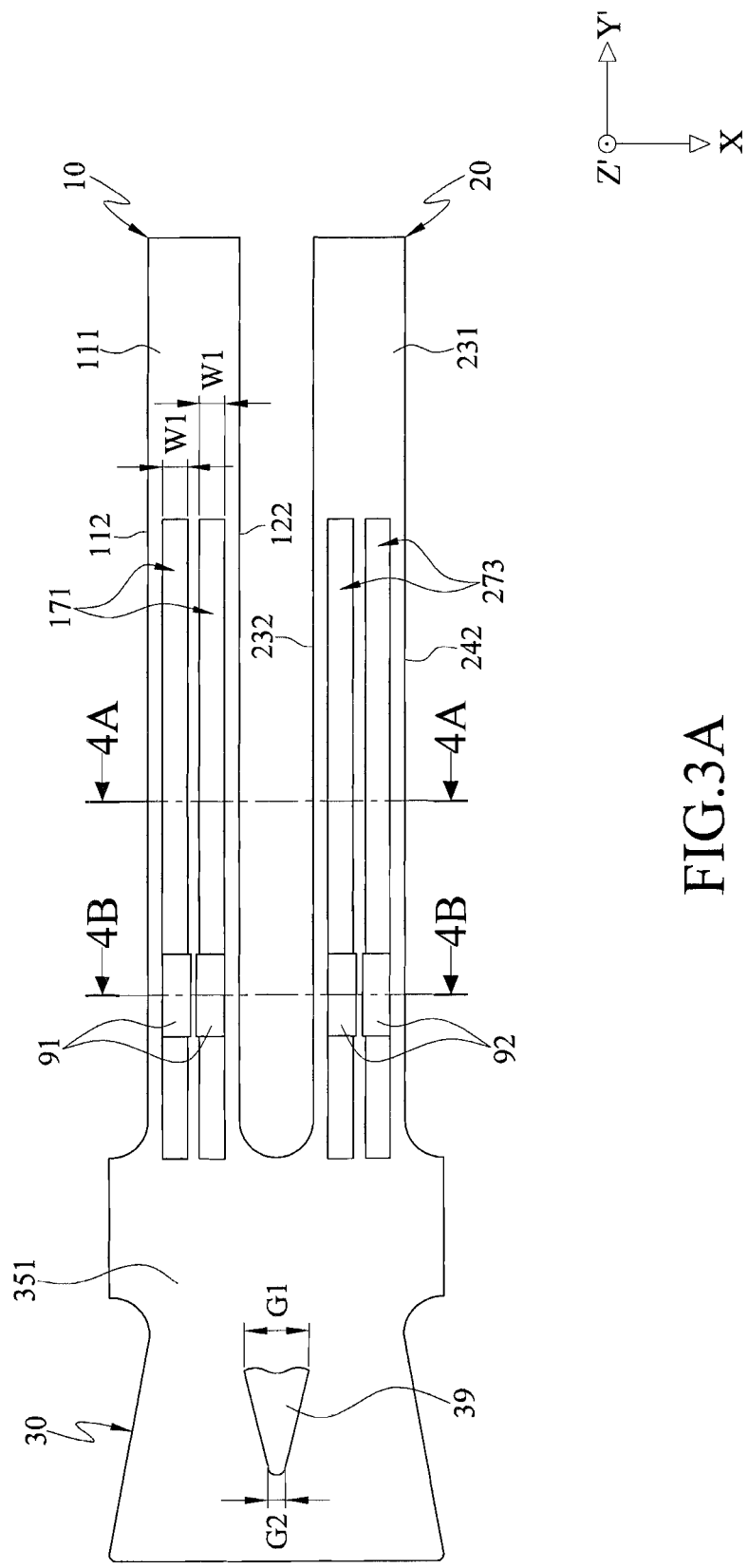
FIG. 3A is a top view of a first embodiment of the present invention.
Figure 3B:
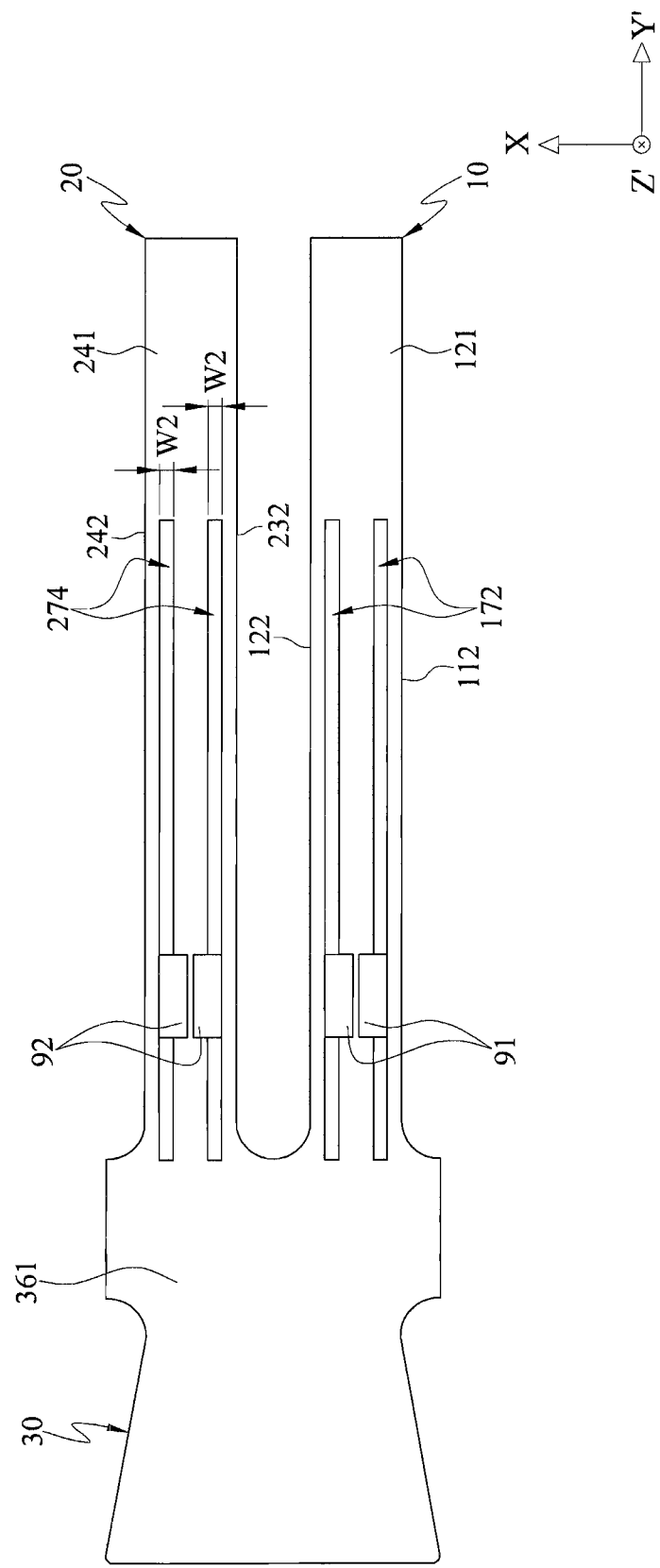
FIG. 3B is a back view of the first embodiment of the present invention.

Refer to FIGS. 1A, 1B, 2A, 2B, 3A, and 3B. FIGS. 1A and 1B are three-dimensional views of the first embodiment of the present invention. FIGS. 3A and 3B are the top and bottom view of the first embodiment. FIGS. 2A and 2B are the electrodes and electrical interconnection patterns of the tuning fork quartz crystal resonator of the first embodiment.

FIGS. 1A and 1B illustrate a tuning fork quartz crystal resonator which comprises a base 30, a first resonating arm 10, and a second resonating arm 20. The first resonating arm 10 and the second resonating arm 20 are connected to same side of the base 30. The base 30 has a fifth main surface 351 and a sixth main surface 361 opposite to each other. The base 30 also has a fifth side surface 352 and a sixth side surface 362 opposite to each other.

The first resonating arm 10 is connected to the base 30. The first resonating arm 10 is approximately a parallelepiped. The first resonating arm 10 has a first main surface 111, a first side surface 112, a second main surface 121, and a second side surface 122 adjacent to each other in sequence. The first main surface 111 and the second main surface 121 are substantially parallel to each other. The first resonating arm 10 has two first groove 171 and two second groove 172. The two first groove 171 are located on the first main surface 111, and the two second groove 172 are located on the second main surface 121. The two first groove 171 are substantially parallel to each other, and the two second groove 172 are substantially parallel to each other.

The second resonating arm 20 is connected to the base 30. The second resonating arm 20 is approximately a parallelepiped. The second resonating arm 20 has a third main surface 231, a third side surface 232, a fourth main surface 241, and a fourth side surface 242 adjacent to each other in sequence. The third main surface 231 and the fourth main surface 241 are substantially parallel to each other. The second resonating arm 20 has two third groove 273 and two fourth groove 274. The two third groove 273 are located on the third main surface 231, and the two fourth groove 274 are located on the fourth main surface 241. The two third groove 273 are substantially parallel to each other, and the two fourth groove 274 are substantially parallel to each other. The first resonating arm 10 and the second resonating arm 20 are approximately parallel to each other. Both resonating arms extend out along the Y' axis.

The first main surface 111 and the third main surface 231 are connected to the fifth main surface 351. The first main surface 111, the third main surface 231, and the fifth main surface 351 are substantially coplanar. The second main surface 121 and the fourth main surface 241 are connected to the sixth main surface 361. The second main surface 121, the fourth main surface 241, and the sixth main surface 361 are substantially coplanar.

Refer to FIGS. 2A and 2B. The first groove 171, the second groove 172, the third side surface 232, and the fourth side surface 242 have a thin metal layer deposited thereon, and are electrically connected to form a part of a first electrode 81. The third groove 273, the fourth groove 274, the first side surface 112, and the second side surface 122 have a thin metal layer deposited thereon, and are electrically connected to form a part of a second electrode 82. The first electrode 81 and the second electrode 82 have opposite polarities. When an AC voltage source which has a frequency close to the natural resonate frequency of the tuning fork is supplied to the first electrode 81 and the second electrode 82, the first resonating arm 10 and the second resonating arm 20 vibrate at the frequency close to the natural resonate frequency. For the convenience of description and clarity of the drawings, the thin metal layer is not shown in all the drawings except FIG. 2A, FIG. 2B, and all cross-sectional views. However, it should be noted that, the thin metal layer has been deposited on the quartz surface to form electrodes and their interconnection in each embodiment.

Figure 4A:
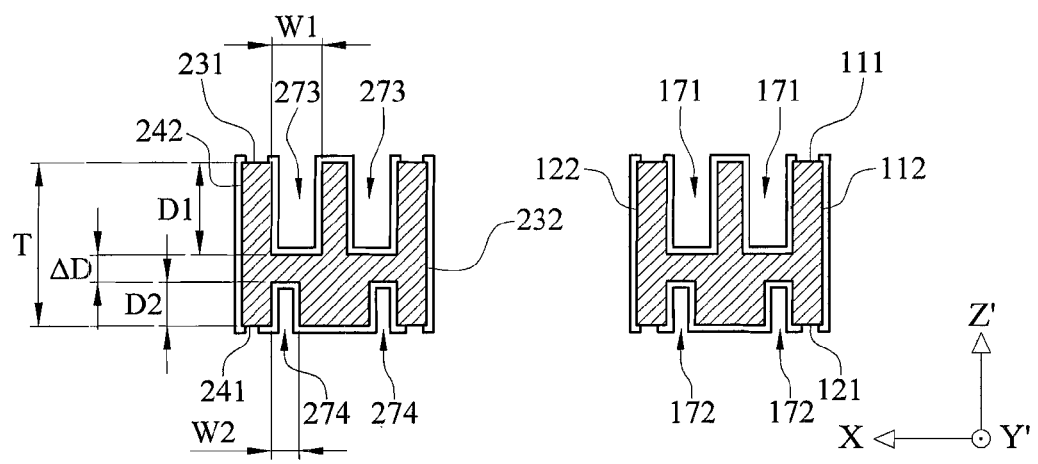
FIG. 4A is a cross-sectional view taken along Line 4A-4A of FIG. 3A.

Refer to FIG. 4A for a cross-sectional view which is taken along Line 4A-4A of FIG. 3A.

The first groove 171, the second groove 172, the third groove 273, and the fourth groove 274 are formed by etching. The depths of the grooves depend on the widths of the grooves, the etching rate, and the etching duration. The wider the groove is and the longer the etching time is, the deeper the groove will be. The similar width and etching direction of the first groove 171 and the third groove 273 lead to form the similar depth of the first groove 171 and the third groove 273.

The similar width and etching direction of the second groove 172 and the fourth groove 274 lead to form the similar depth of the second groove 172 and the fourth groove 274.

The first groove 171 is asymmetric to the second groove 172. The third groove 273 is asymmetric to the fourth groove 274. The asymmetric structures can be asymmetric in the depth, the width, and the number of the grooves. The first groove 171 and the third groove 273 are asymmetric to the second groove 172 and the fourth groove 274 respectively.

The R1 value of the resonator can be reduced by forming proper width and the depth of the first groove 171, the second groove 172, the third groove 273, and the fourth groove 274. For example, when the width of the first groove 171, the second groove 172, the third groove 273, and the fourth groove 274 is widened, the strength of the electrical field along the X axis on the first resonating arm 10 and the second resonating arm 20 is intensified due to a narrower distance of the two electrodes (the first and second electrodes). A wider groove shortens the distance of the two electrodes on the resonating arms, that intensifies an effective and stronger strength of the electrical field along the X axis, thereby increases the C1 value and reduces the R1 value of the resonator.

The width of the first groove 171 and the third groove 273 is denoted as a first width (W1), and the width of the second groove 172 and the fourth groove 274 is denoted as a second width (W2). The depth of the first groove 171 and the third groove 273 is denoted as a first depth (D1), and the depth of the second groove 172 and the fourth groove 274 is denoted as a second depth (D2). T is the thickness of the resonating arm 10 and 20. $\Delta D$ is the difference of T from the sum of D1 and D2 ($\Delta D = T - D1 - D2$). In other words, $\Delta D$ is the residual thickness of the resonating arm after the depth of the first groove 171 (the third groove 273) and the depth of the second groove 172 (the fourth groove 274) are deducted from the resonating arm thickness T.

In this embodiment, since the first width W1 is greater than the second width W2. The first depth D1 is greater than the second depth D2. The first groove 171 is asymmetric to the second groove 172, and the third groove 273 is asymmetric to the fourth groove 274. The first depth D1 is substantially different from the second depth D2.

Figure 4B:
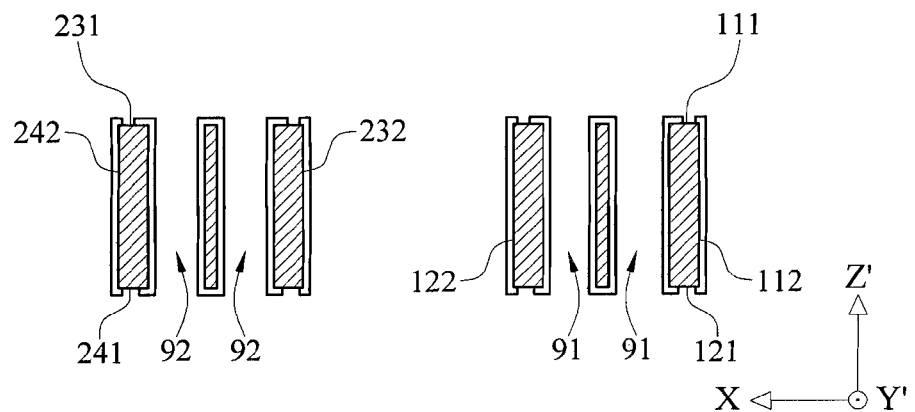
FIG. 4B is a cross-sectional view taken along Line 4B-4B of FIG. 3A.

FIG. 4B is a cross-sectional view which is taken along Line 4B-4B of FIG. 3A. In order to complete the first electrode 81 and the second electrode 82, there are two first via-hole 91 on the first resonating arm 10 and two second via-hole 92 on the second resonating arm 20. The metal film on the surface of the first via-hole 91 connects the metal film on the surface of the first groove 171 to the metal film on the surface of the second groove 172 to form a part of the first electrode 81. The metal film on the surface of the second via-hole 92 connects the metal film on the surface of the third groove 273 to the metal film on surface of the fourth groove 274 to form a part of the second electrode 82.

Figure 5A:
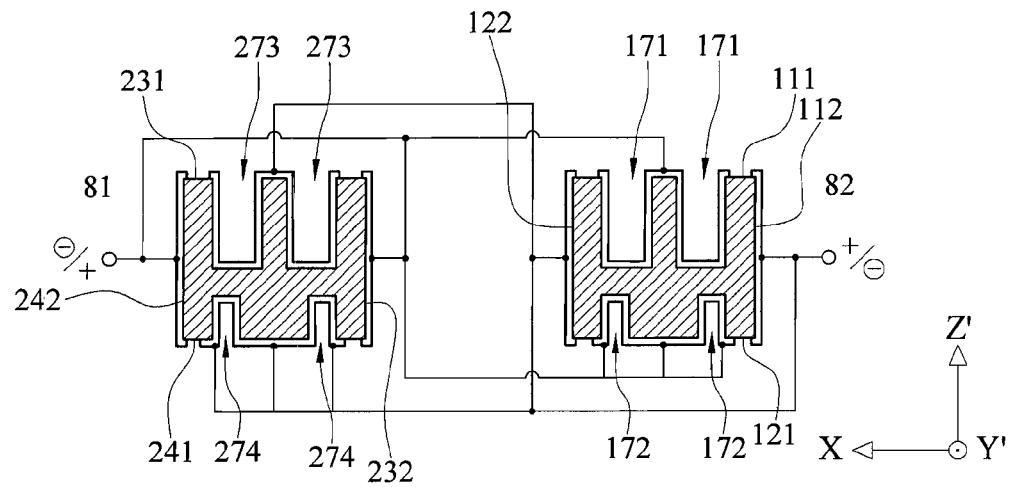
FIG. 5A is a schematic view of an electrical connection relation of FIG. 4A.
Figure 5B:
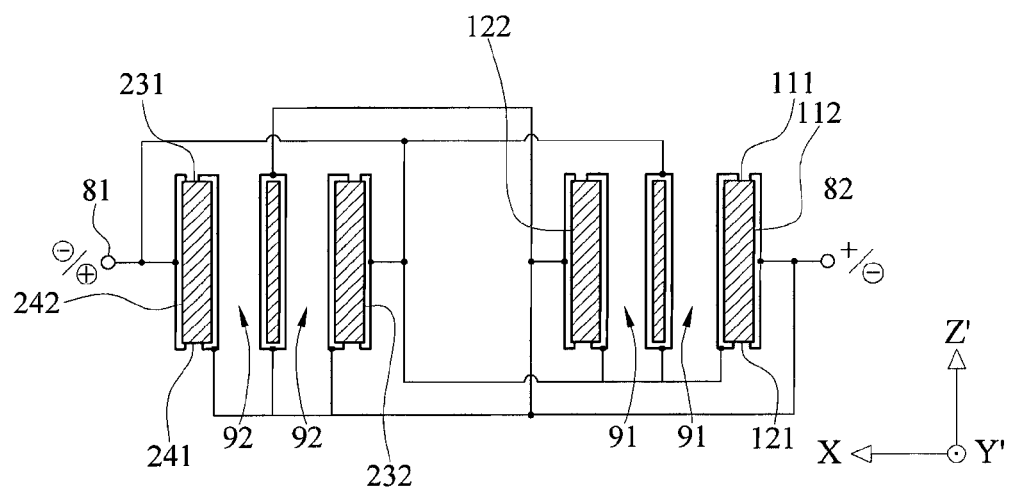
FIG. 5B is a schematic view of an electrical connection relation of FIG. 4B.

Refer to FIGS. 5A and 5B. FIGS. 5A and 5B illustrate the electrical interconnection of the electrodes shown on FIGS. 4A and 4B. The metal film on the surface of the two first groove 171, the metal film on the surface of the two second groove 172, the metal film on the surface of the two first via-hole 91, the metal film on the third side surface 232, and the metal film on the fourth side surface 242 are electrically connected to form the first electrode 81. The metal film on the surface of the two third groove 273, the metal film on surface of the two fourth groove 274, the metal film on the surface of the two second via-hole 92, the metal film on the first side surface 112, and the metal film on the second side surface 122 are electrically connected to form the second electrode 82.

Figure 4C:
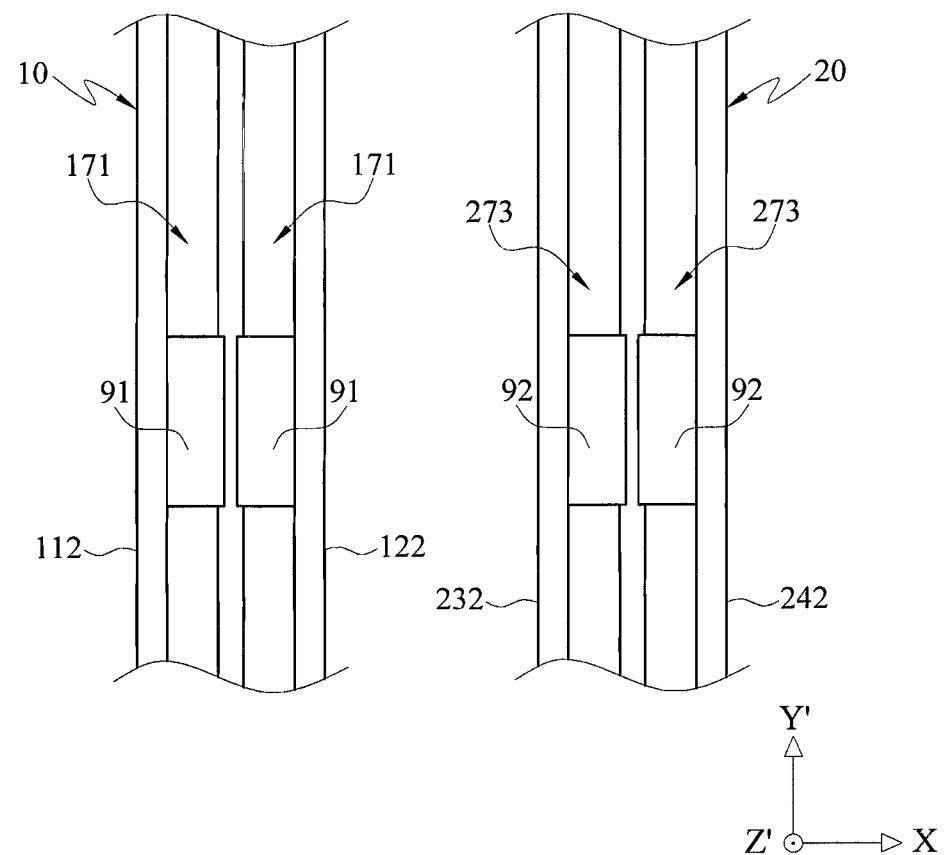
FIG. 4C is a partial enlarged view of FIG. 3A.
Figure 4D:
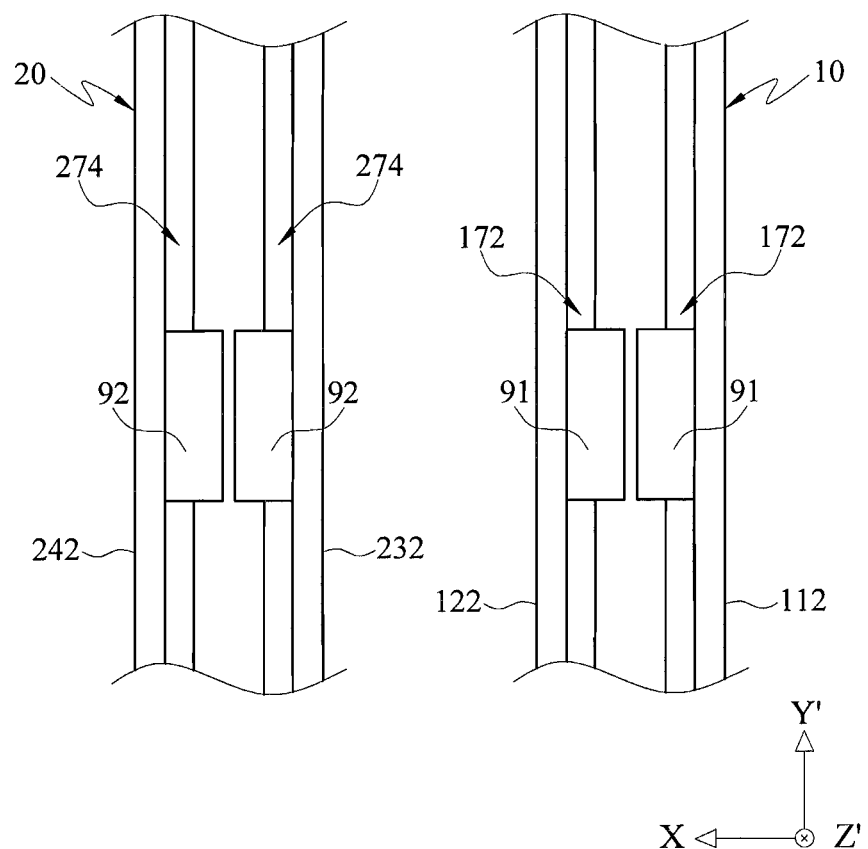
FIG. 4D is a partial enlarged view of FIG. 3B.

FIGS. 4C and 4D are a partially enlarged view of FIGS. 3A and 3B. Refer to FIG. 4C, viewing from the top of the first main surface 111, one of the two first via-hole 91 is partially embedded in the first groove 171 which is close to the first side surface 112, and the other first via-hole 91 is partially embedded in the other first groove 171 which is close to the second side surface 122. Viewing from the top of the third main surface 231, one of the two second via-hole 92 is partially embedded in the third groove 273 which is close to the third side surface 232, and the other second via-hole 92 is partially embedded in the other third groove 273 which is close to the fourth side surface 242. Refer to FIG. 4D. Viewing from the top of the second main surface 121, one of the two first via-hole 91 is partially embedded in the second groove 172 which is close to the first side surface 112, and the other first via-hole 91 is partially embedded in the other second groove 172 which is close to the second side surface 122. Viewing from the top of the fourth main surface 241, one of the two second via-hole 92 is partially embedded in the fourth groove 274 which is close to the third side surface 232, and the other second via-hole 92 is partially embedded in the other fourth groove 274 which is close to the fourth side surface 242.

Refer to FIGS. 1A and 1B. Two concave 95 are formed on the side surfaces of the base 30, one each on the fifth side surface 352 and the sixth side surface 362 respectively. The concave 95 is a continuous curved surface comprising a turning segment 961, a first connecting segment 971, and a second connecting segment 972. The turning segment 961 connects the first connecting segment 971 with the second connecting segment 972. The second connecting segment 972 is ended at 359 (the end of base 30). The first connecting segment 971 is close to the other end of the base 30 which is opposite to the end 359. One concave 95 constitutes an integral part of the fifth side surface 352 and the other concave 95 constitutes an integral part of the sixth side surface 362. The two concaves 95 are substantially symmetric to each other along the Y' axis. The shortest distance between the fifth side surface 352 and the sixth side surface 362 is the measurement from the turning segment 961 of the concave 95 on the fifth side surface 352 to the turning segment 961 of the concave 95 on the sixth side surface 362. The longest distance between the fifth side surface 352 and the sixth side surface 362 is the end 359 of the base 30. The rate of change of slop of the first connecting segment 971 is greater than that of the second connecting segment 972. The difference of the rate of change of slope between the first connecting segment 971 and the second connecting segment 972 of the concave 95 may be obtained by the finite element analysis and practical experiment according to actual requirements.

The forming of concave 95 on the base is to minimize the acoustic energy propagating to the mounting areas of the base 30. This will prevent the decrease of the Q value of the resonator. The detailed design of the concave 95 may be obtained by the finite element analysis and practical experiment according to actual requirements.

A recess 39 formed on the fifth main surface 351 of the base 30 functions to reduce the acoustic energy propagating to the mounting areas of the base 30. This will prevent the decrease of the Q value of the resonator. The recess 39 concaves inwards into the base 30 from the fifth main surface 351 along the Z' axis. Refer to FIG. 3A. One end of the recess 39 near the first resonating arm 10 and the second resonating arm 20 has a first width G1 (a width along the X axis), and the other end of the recess 39 away from the first resonating arm 10 and the second resonating arm 20 has a second width G2 (a width along the X axis). The first width G1 is greater than the second width G2.

Viewing from the fifth main surface 351, the shape of the recess 39 is approximately a triangle. However, the recess 39 in the present invention is not limited to a triangle. It can be square, round, or polygonal. Preferably, the recess 39 is an acute triangle with a base line parallel to the end 359 of the base 30, and each vertex of the polygon has an arc chord angle to eliminate sharp points for accumulating stress. The recess 39 is formed on the fifth main surface 351 in this embodiment. The recess 39 functions the same when it is formed on the sixth main surface 361.

Figure 6A:
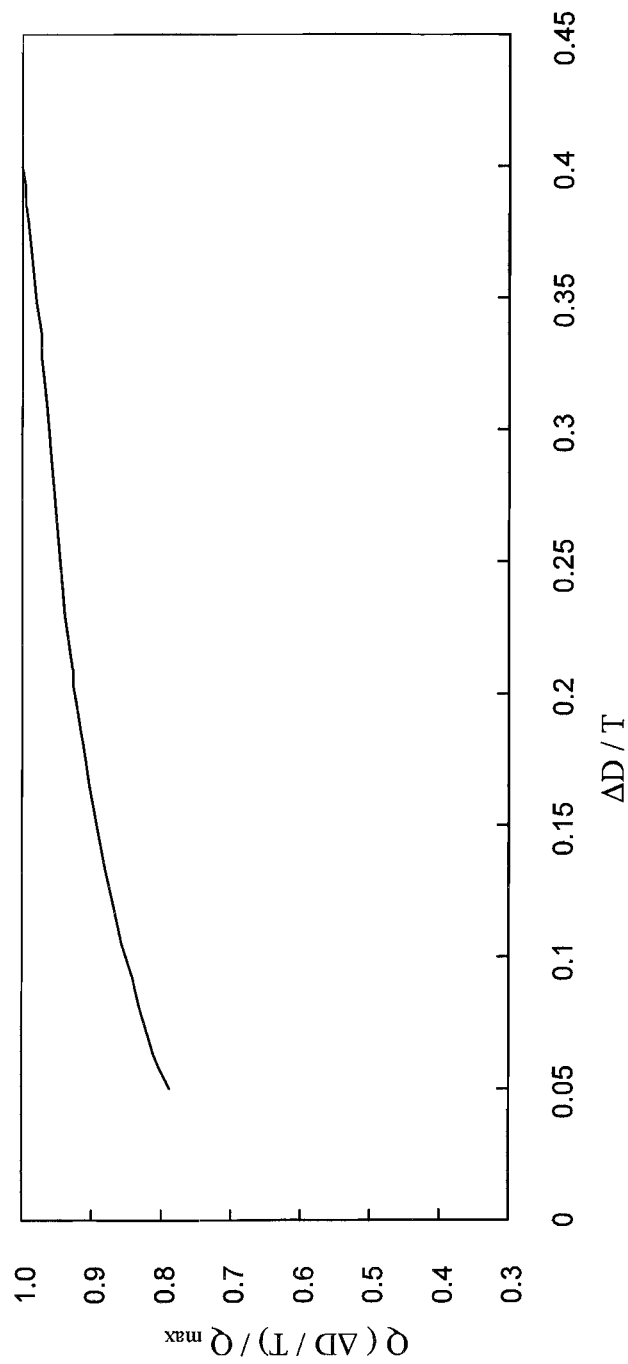
FIG. 6A is a schematic curve diagram of Q values of a tuning fork quartz crystal resonator at different groove depths according to the first embodiment of the present invention.
Figure 6B:
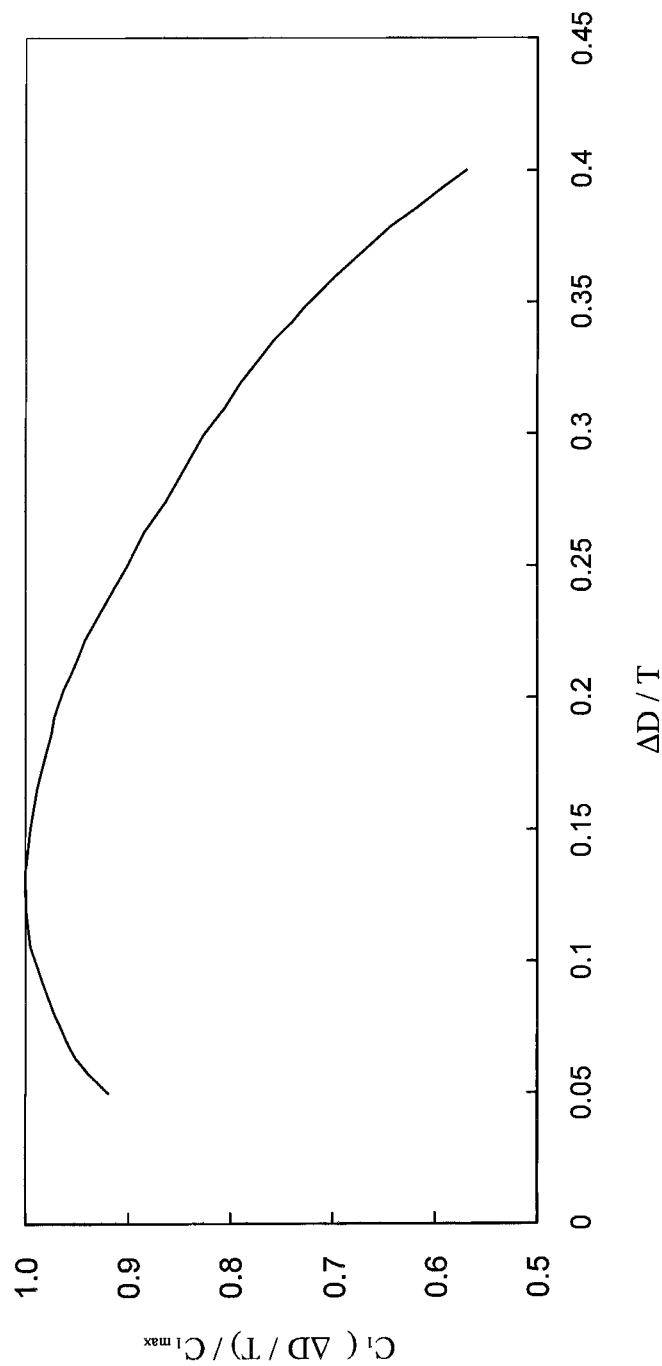
FIG. 6B is a schematic curve diagram of C1 values of the tuning fork quartz crystal resonator at different groove depths according to the first embodiment of the present invention.
Figure 6C:
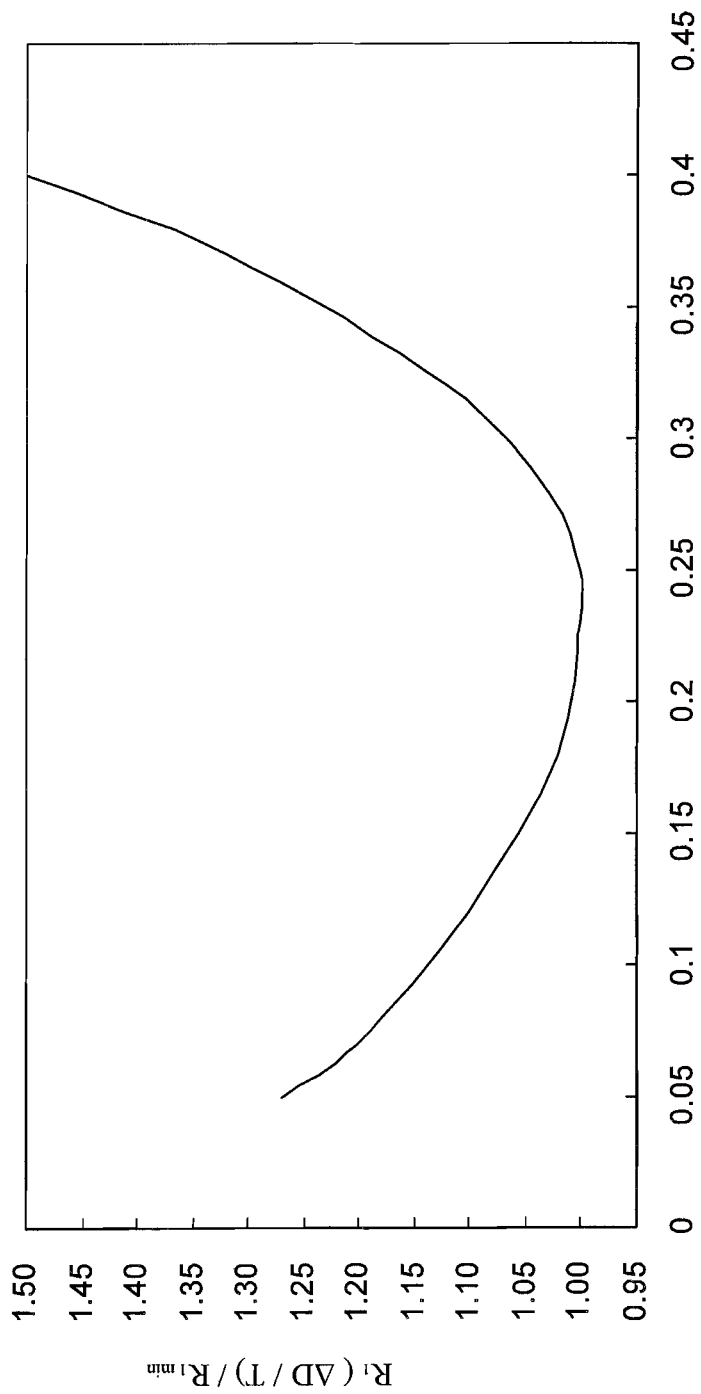
FIG. 6C is a schematic curve diagram of R1 values of the tuning fork quartz crystal resonator at different groove depths according to the first embodiment of the present invention.

The depth of the grooves will affect the Q, C1, and R1 value of the quartz crystal resonator. Their relationships are illustrated respectively in FIGS. 6A, 6B, and 6C. Referring to FIGS. 3A, 3B, and 4A, there are two grooves on both main surfaces of the first resonating arm 10 and the second resonating arm 20 respectively. D1 is the depth of the first groove 171 and the third groove 273. D2 is the depth of the second groove 172 and the fourth groove 274. T is the thickness of the resonating arm 10 and 20. $\Delta D$ is the difference of T from the sum of D1 and D2 ($\Delta D = T - D1 - D2$). $\Delta D/T$ is the ratio of $\Delta D$ over the thickness of resonating arm T. When forming the grooves on the resonating arms during the manufacturing processes, longer quartz etching time will produce deeper grooves, namely greater D1 and D2 value. The deeper the grooves are, the smaller the $\Delta D$ value becomes, and the lower the $\Delta D/T$ ratio will be. Referring to FIG. 6A, the vertical axis has the scale value of the ratio of $Q(\Delta D/T)/Q$ max, where Q max is the maximum of the Q value. The horizontal axis has the scale value of the ratio of $\Delta D/T$. Referring to FIG. 6B, the vertical axis has the scale value of the ratio of $C1(\Delta D/T)/C1$ max, where C1 max is the maximum of the C1 value. The horizontal axis has the scale value of the ratio of $\Delta D/T$. Referring to FIG. 6C, the vertical axis has the scale value of the ratio of $R1 (\Delta D/T)/R1$ min, where R1 min is the minimum of the R1 value. The horizontal axis has the scale value of the ratio of $\Delta D/T$. FIG. 6A illustrates the relationship of $\Delta D/T$ and the Q value of the resonator. When $\Delta D/T$ is within the range of 0.4 to 0.05, the Q value of the resonator decreases approximately 20% as the ratio of $\Delta D/T$ decreases. FIG. 6B shows the relationship between $\Delta D/T$ and the C1 value of the resonator. When $\Delta D/T$ is within the range of 0.4 to 0.05, the C1 value of the resonator gradually increases as the ratio of $\Delta D/T$ decreases. This leads to a reduction of the R1 value of the resonator within the range. FIG. 6C illustrates the relationship between $\Delta D/T$ and the R1 value of the resonator. When $\Delta D/T$ is within the range of 0.4 to 0.05, the R1 value of the resonator has relatively low value to ensure the excellent performance of the resonator. When the ratio of $\Delta D/T$ is greater than 0.4 due to a smaller and insufficient depth value of D1 and D2, the R1 value of the resonator increases greatly while the resonator still maintains its high Q value. The usage and application of the resonators with a high Q value and a high R1 value are quite limited because of practical difficulties in circuit design. When the ratio of $\Delta D/T$ is less than 0.05 due to an excessive depth value of D1 and D2, the Q value of the resonator decreases rapidly and therefore causes the R1 value of the resonator to increase. Thus the performance of the resonator is greatly deteriorated. In summary, when the ratio of $\Delta D/T$ is in the range of 0.4 to 0.05, not only the Q value of the resonator is maintained at a relatively high quality level, but also the R1 value of the resonator is kept at a relatively low value. A resonator with high Q value and low R1 value in this range ensures its excellent performance.

From this experiment, the valid value of ΔD/T falls in the range of 0.05 to 0.4, with an optimum value in the range of 0.1 to 0.32.

Second Embodiment

In the present invention, in addition to the structure of the first embodiment, the following variations may be made. Persons skilled in the art will be able to design or manufacture the quartz crystal resonator of similar structure according to the spirit of the present invention.

Figure 7A:
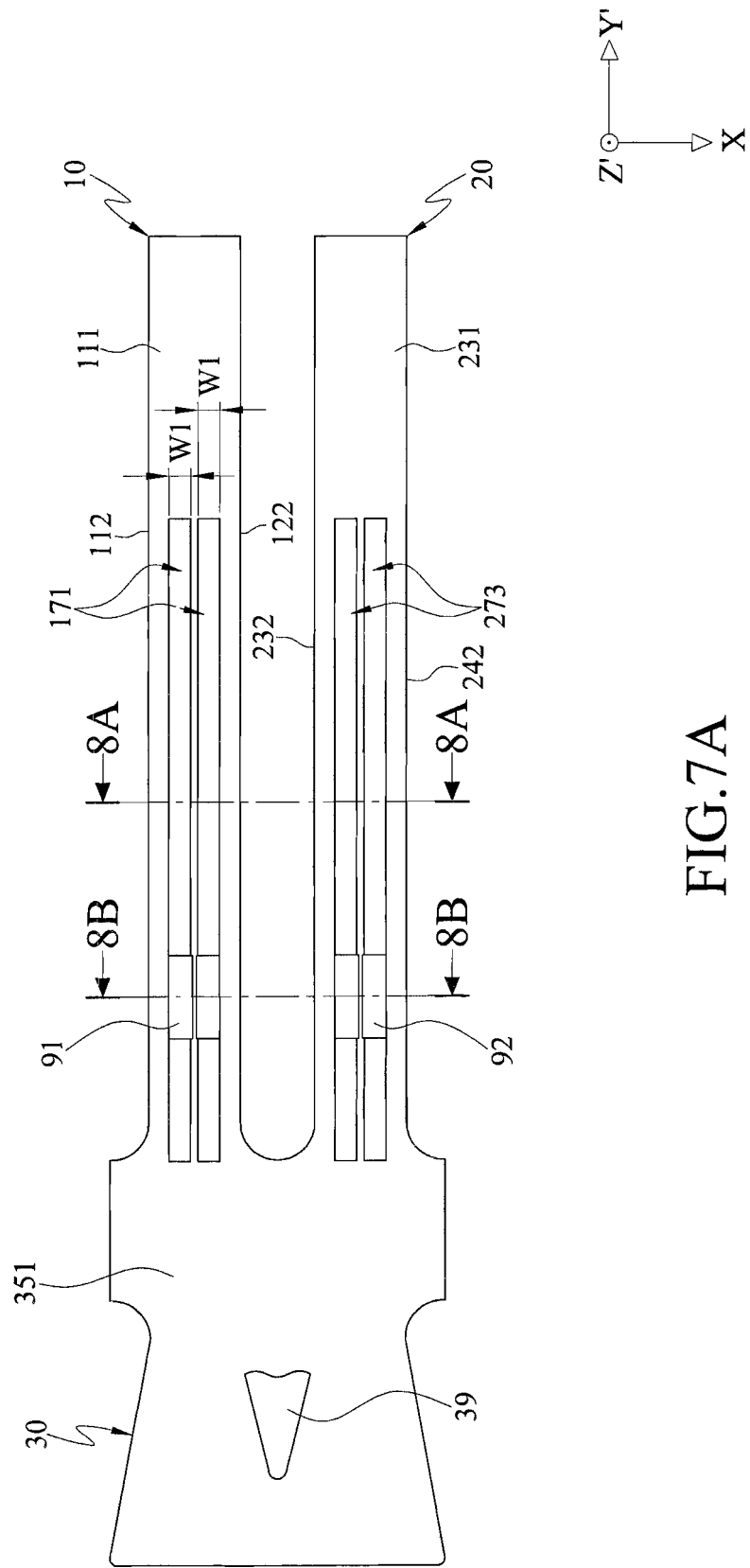
FIG. 7A is a top view of a second embodiment of the present invention.
Figure 7B:
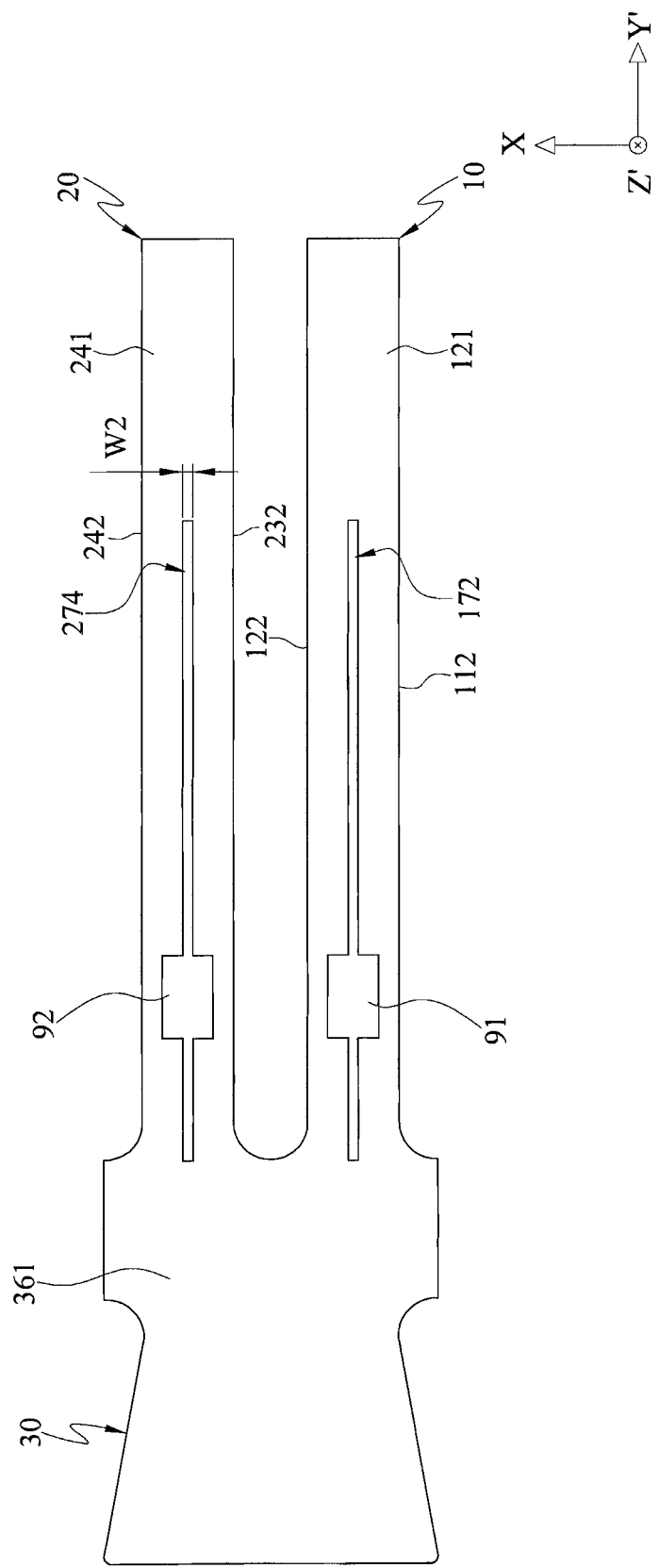
FIG. 7B is a back view of the second embodiment of the present invention.

FIGS. 7A and 7B are the top and bottom view of the second embodiment of the present invention. The tuning fork quartz crystal resonator comprises a base 30, a first resonating arm 10, and a second resonating arm 20. The first resonating arm 10 and the second resonating arm 20 are connected to same side of the base 30.

The base 30 has a fifth main surface 351 and a sixth main surface 361 opposite to each other. The base 30 also has a fifth side surface (not shown) and a sixth side surface (not shown) opposite to each other.

The first resonating arm 10 is connected to the base 30. The first resonating arm 10 is approximately a parallelepiped. The first resonating arm 10 has a first main surface 111, a first side surface 112, a second main surface 121, and a second side surface 122 adjacent to each other in sequence. The first main surface 111 and the second main surface 121 are substantially parallel to each other. The first resonating arm 10 has two first groove 171 and one second groove 172. The two first groove 171 are located on the first main surface 111, and the second groove 172 is located on the second main surface 121. The two first groove 171 are substantially parallel to each other.

The second resonating arm 20 is also connected to the base 30. The second resonating arm 20 is approximately a parallelepiped. The second resonating arm 20 has a third main surface 231, a third side surface 232, a fourth main surface 241, and a fourth side surface 242 adjacent to each other in sequence. The third main surface 231 and the fourth main surface 241 are substantially parallel to each other. The second resonating arm 20 has two third groove 273 and one fourth groove 274. The two third groove 273 are located on the third main surface 231, and the fourth groove 274 is located on the fourth main surface 241. The two third groove 273 are substantially parallel to each other. The first resonating arm 10 and the second resonating arm 20 are approximately parallel to each other. Both resonating arms extend out along the Y' axis.

The first main surface 111 and the third main surface 231 are connected to the fifth main surface 351. The first main surface 111, the third main surface 231, and the fifth main surface 351 are substantially coplanar. The second main surface 121 and the fourth main surface 241 are connected to the sixth main surface 361. The second main surface 121, the fourth main surface 241, and the sixth main surface 361 are substantially coplanar.

Figure 8A:
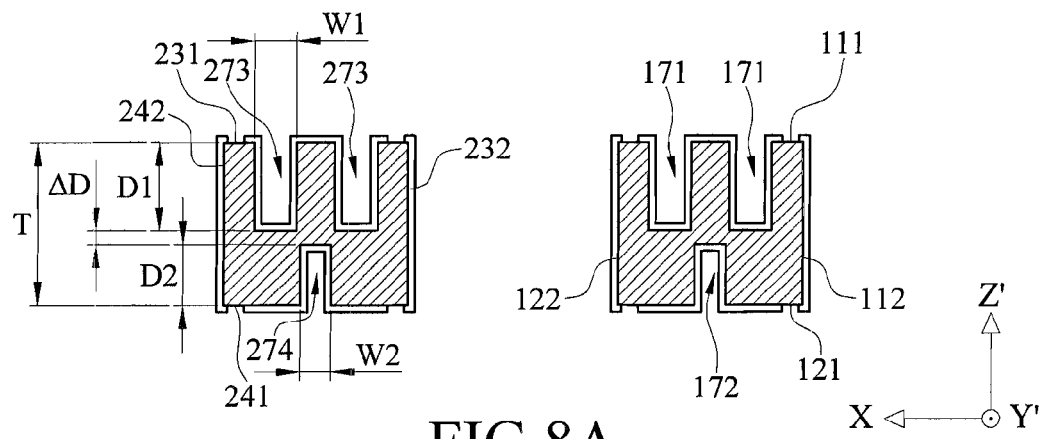
FIG. 8A is a cross-sectional view taken along Line 8A-8A of FIG. 7A.
Figure 8B:
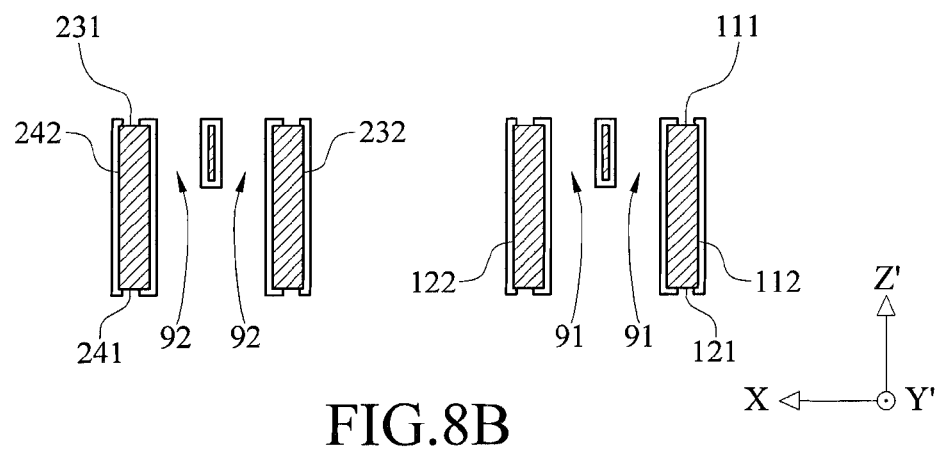
FIG. 8B is a cross-sectional view taken along Line 8B-8B of FIG. 7A.

FIG. 8A is a cross-sectional view taken along Line 8A-8A of FIG. 7A, and FIG. 8B is a cross-sectional view taken along Line 8B-8B of FIG. 7A. The widths of the two first groove 171 on the first main surface 111 are substantially the same, and the depths thereof are also substantially the same. The widths of the two third groove 273 on the third main surface 231 are substantially the same, and the depths thereof are also substantially the same. In this embodiment, the first width W1 is the width of the first groove 171 and the third groove 273. The second width W2 is the width of the second groove 172 and the fourth groove 274. The second width W2 is smaller than a distance between the two neighboring flanks of the two first groove 171 (or the two third groove 273) in the width direction of the resonating arm. This distance also indicates the separation of the two first groove 171 (or the two third groove 273) along the X axis. The first depth D1 is the depth of the first groove 171 and the third groove 273. The second depth D2 is the depth of the second groove 172 and the fourth groove 274. Since the first width W1 is greater than the second width W2, the first depth D1 is greater than the second depth D2. T is the thickness of the first resonating arm 10 and the second resonating arm 20. ΔD is the difference of T from the sum of D1 and D2 (ΔD=T−D1−D2). In other words, ΔD is the residual thickness of the resonating arm after the depth of the first groove 171 (the third groove 273) and the depth of the second groove 172 (the fourth groove 274) are deducted from the resonating arm thickness T.

Refer to FIG. 7A. Viewing from the top of the first main surface 111, one of the two first via-hole 91 is partially embedded in the first groove 171 which is close to the first side surface 112, and the other first via-hole 91 is partially embedded in the other first groove 171 which is close to the second side surface 122. Viewing from the top of the third main surface 231, one of the two second via-hole 92 is partially embedded in the third groove 273 which is close to the third side surface 232, and the other second via-hole 92 is partially embedded in the other third groove 273 which is close to the fourth side surface 242. Refer to FIG. 7B. Viewing from the top of the second main surface 121, the two first via-hole 91 starting from the first main surface 111 to the second main surface 121 merge together with a portion of the second groove 172 and form one opening on the second main surface 121. Viewing from the top of the fourth main surface 241, the two second via-hole 92 starting from the third main surface 231 to the fourth main surface 241 merge together with a portion of the fourth groove 274 and form one opening on the fourth main surface 241.

Figure 9:
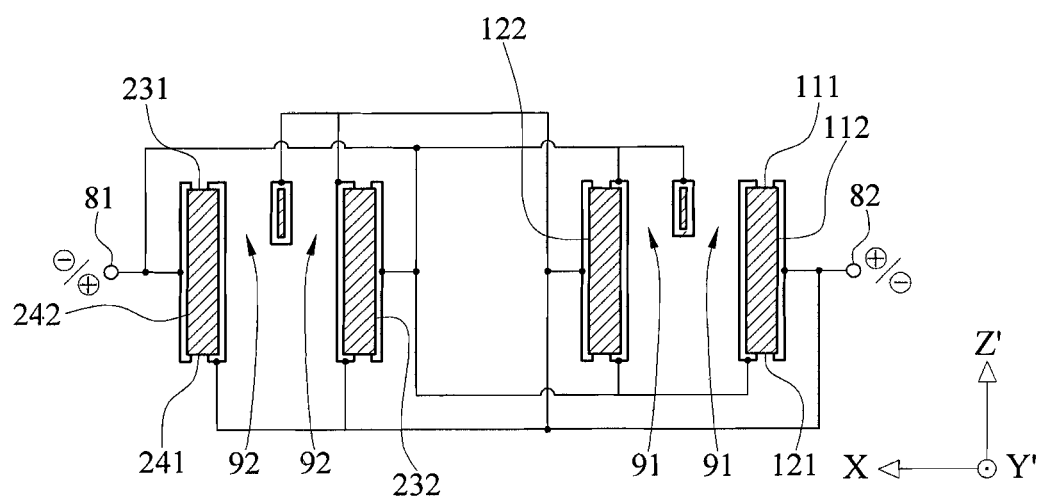
FIG. 9 is a schematic view of an electrical connection relation of FIG. 8B.

FIG. 9 illustrates the electrical interconnection of the electrodes shown on FIG. 8B. The metal film on the surface of the two first groove 171, the metal film on the surface of the second groove 172, the metal film on the surface of the two first via-hole 91, the metal film on the third side surface 232, and the metal film on the fourth side surface 242 are electrically connected to form a first electrode 81. The metal film on the surface of the two third groove 273, the metal film on the surface of the fourth groove 274, the metal film on the surface of the two second via-hole 92, the metal film on the first side surface 112, and the metal film on the second side surface 122 are electrically connected to form a second electrode 82.

Referring to FIGS. 8B and 9, the metal film on the surface of the two first grooves 171 and the metal film on the surface of the second groove 172 are electrically connected and effectively conducted via the metal film on the surface of the two first via-holes 91. The metal film on the surface of the two third grooves 273 and the metal film on the surface of the forth groove 274 are electrically connected and effectively conducted via the metal film on the surface of the two second via-holes 92.

Figure 10A:
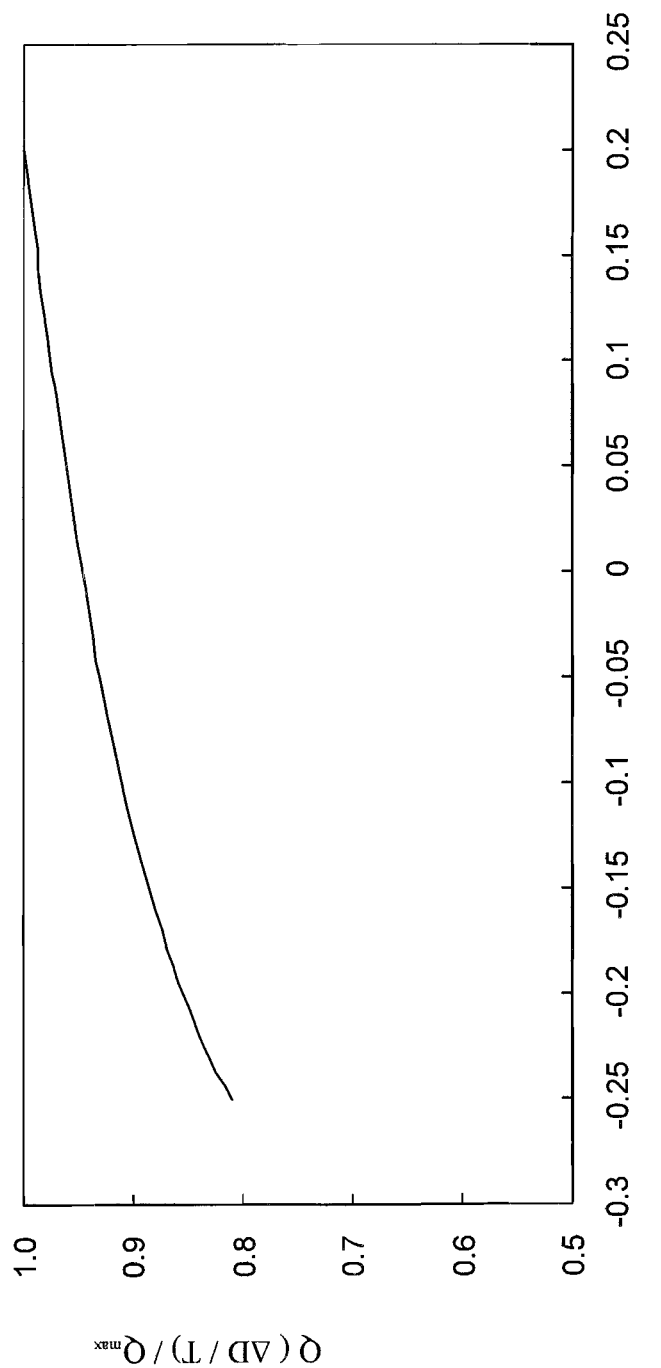
FIG. 10A is a schematic curve diagram of Q values of a tuning fork quartz crystal resonator at different groove depths according to the second embodiment of the present invention.
Figure 10B:
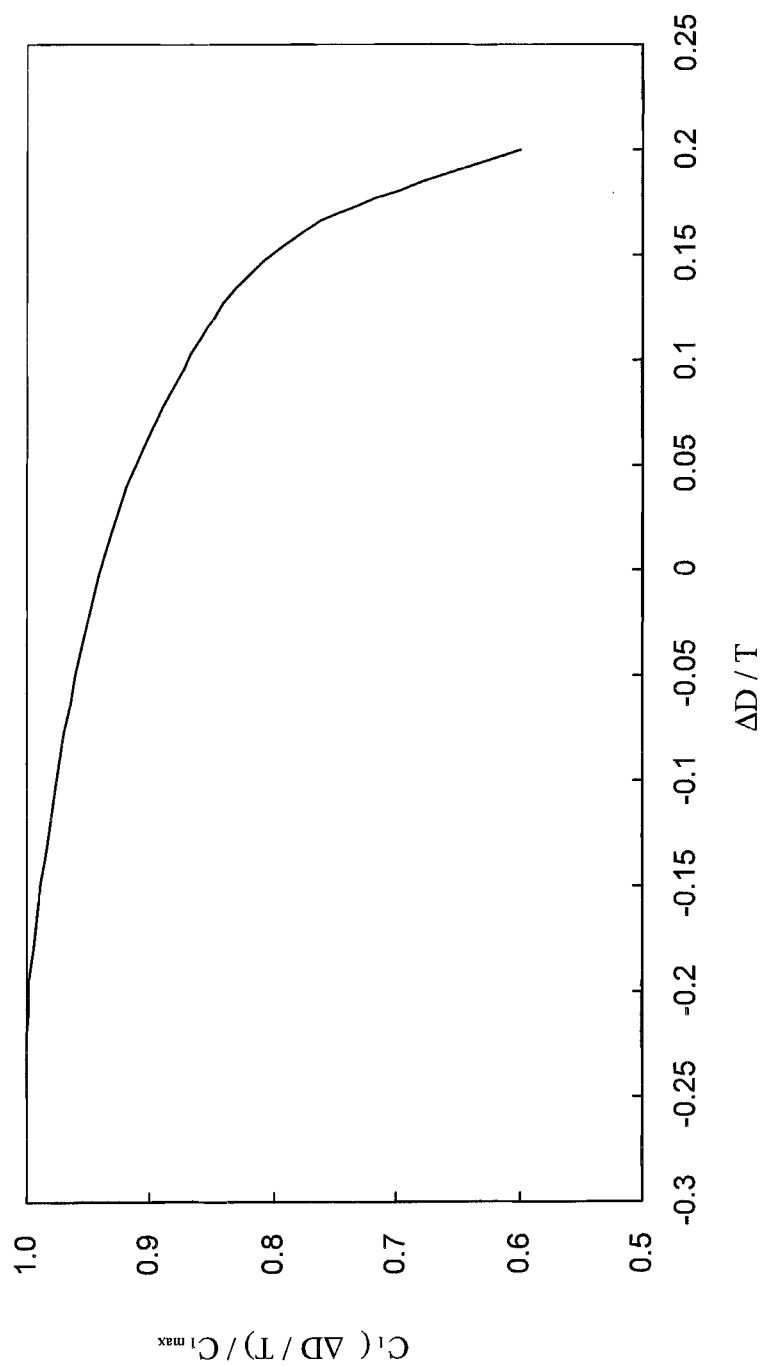
FIG. 10B is a schematic curve diagram of C1 values of the tuning fork quartz crystal resonator at different groove depths according to the second embodiment of the present invention.
Figure 10C:
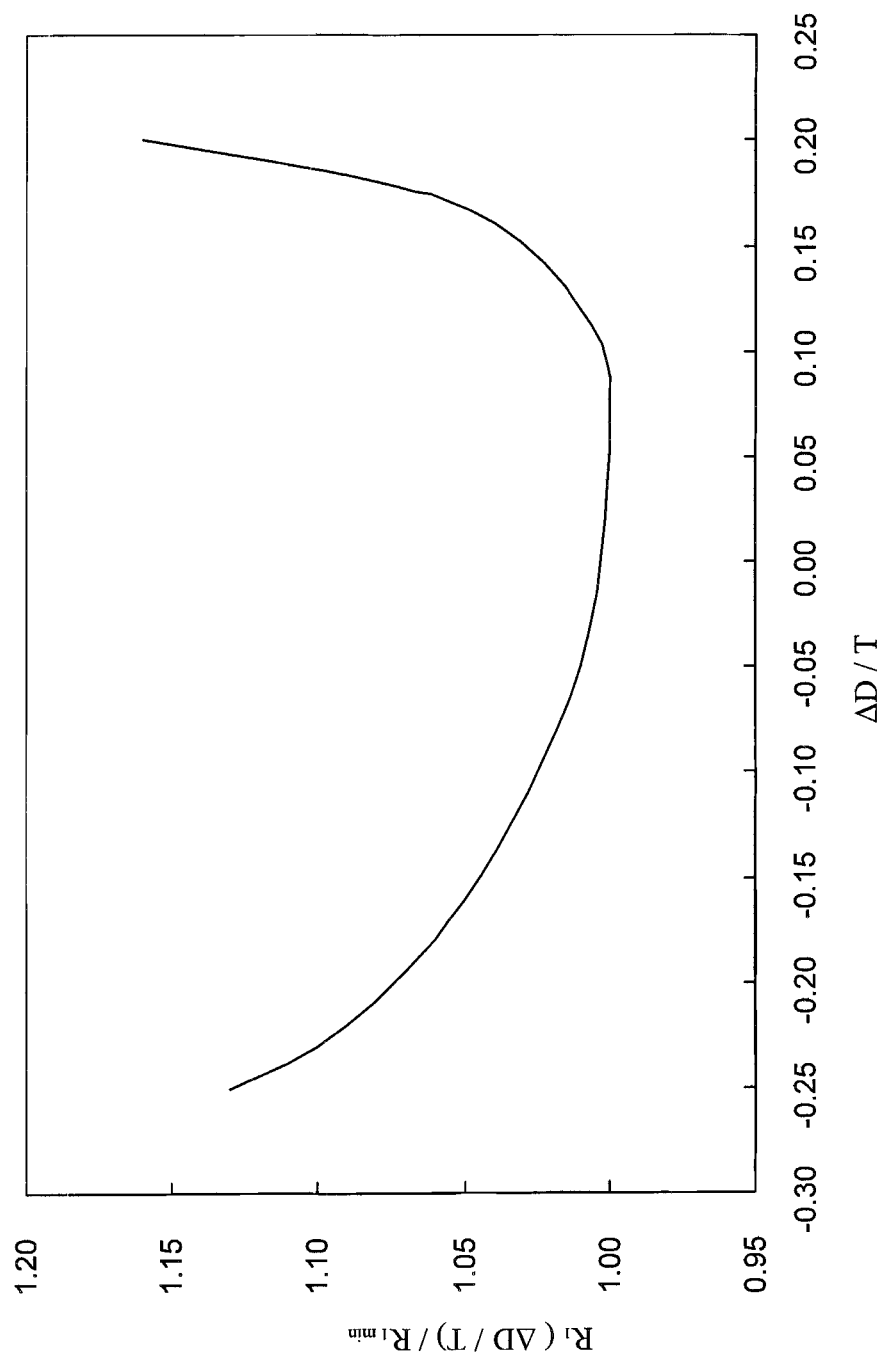
FIG. 10C is a schematic curve diagram of R1 values of the tuning fork quartz crystal resonator at different groove depths according to the second embodiment of the present invention.

The depth of the grooves will affect the Q, C1, and R1 value of the quartz crystal resonator. Their relationships are illustrated respectively in FIGS. 10A, 10B, and 10C. Referring to FIGS. 7A, 7B, and 8A, there are two first groove 171 on the first main surface 111 of the first resonating arm 10 and two third grooves 273 on the third main surface 231 of the second resonating arm 20. There is only one second groove 172 on the second main surface 121 of the first resonating arm 10 and one fourth groove 274 on the fourth main surface 241 of the second resonating arm 20. D1 is the depth of the first groove 171 and the third groove 273. D2 is the depth of the second groove 172 and the fourth groove 274. T is the thickness of the resonating arm 10 and 20. ΔD is the difference of T from the sum of D1 and D2 (ΔD=T−D1−D2). ΔD/T is the ratio of ΔD over the thickness of resonating arm T. When forming the grooves on the resonating arms during the manufacturing processes, longer etching time will produce deeper grooves, namely greater D1 and D2 value. The deeper the grooves are, the smaller the ΔD value becomes, and the lower the ΔD/T ratio will be. Referring to FIG. 10A, the vertical axis has the scale value of the ratio of Q(ΔD/T)/Q max, where Q max is the maximum of the Q value. The horizontal axis has the scale value of the ratio of ΔD/T. Referring to FIG. 10B, the vertical axis has the scale value of the ratio of C1(ΔD/T)/C1 max, where C1 max is the maximum of the C1 value. The horizontal axis has the scale value of the ratio of ΔD/T. Referring to FIG. 10C, the vertical axis has the scale value of the ratio of R1(ΔD/T)/R1 min, where R1 min is the minimum of the R1 value. The horizontal axis has the scale value of the ratio of ΔD/T. FIG. 10A illustrates the relationship of ΔD/T and the Q value of the resonator. When ΔD/T is within the range of +0.18 to −0.25, the Q value of the resonator decreases approximately 20% as the ratio of ΔD/T decreases. FIG. 10B shows the relationship between ΔD/T and the C1 value of the resonator. When ΔD/T is within the range of +0.18 to −0.25, the C1 value of the resonator gradually increases as the ratio of ΔD/T decreases. This leads to a reduction of R1 value of the resonator within the range. FIG. 10C illustrates the relationship between ΔD/T and the R1 value of the resonator. When ΔD/T is within the range of +0.18 to −0.25, the R1 value of the resonator has relatively low value to ensure the excellent performance of the resonator. When the ratio of ΔD/T is greater than +0.18 due to a smaller and insufficient depth value of D1 and D2, the R1 value of the resonator increases greatly while the resonator still maintains its high Q value. The usage and application of the resonators with a high Q value and a high R1 value are quite limited because of practical difficulties in circuit design. When the ratio of ΔD/T is less than −0.25 due to an excessive depth value of D1 and D2, the Q value of the resonator decreases rapidly and therefore causes the R1 value of the resonator to increase. Thus the performance of the resonator is greatly deteriorated. In summary, when the ratio of ΔD/T is in the range of +0.18 to −0.25, not only the Q value of the resonator is maintained at a relatively high quality level, but also the R1 value of the resonator is kept at a relatively low value. A resonator with high Q value and low R1 value in this range ensures its excellent performance. From this experiment, the valid ratio of ΔD/T falls in the range of −0.25 to +0.18, with an optimum value in the range of −0.15 to +0.12.

Third Embodiment

Figure 11B:
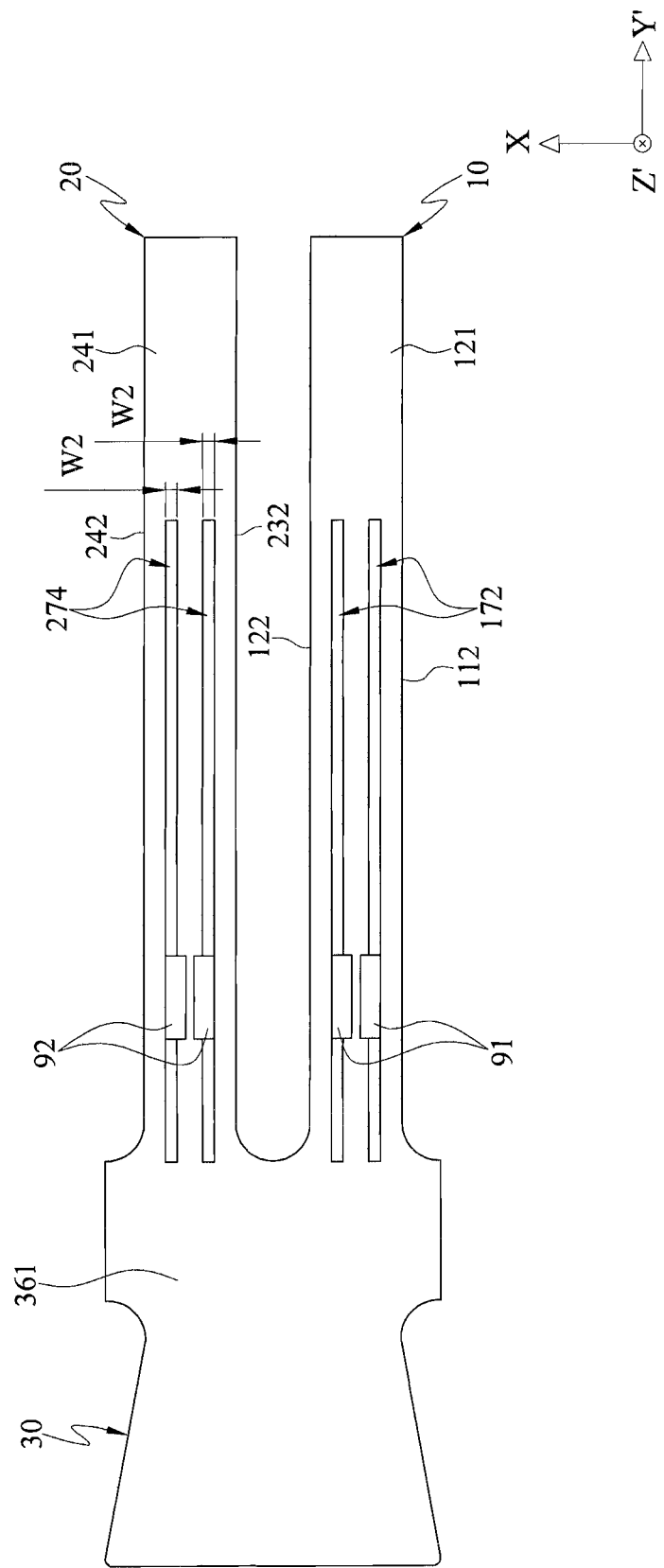
FIG. 11B is a back view of the third embodiment of the present invention.

FIGS. 11A and 11B are the top view and bottom view of the third embodiment of the present invention. The tuning fork quartz crystal resonator comprises a base 30, a first resonating arm 10, and a second resonating arm 20. The first resonating arm 10 and the second resonating arm 20 are connected to same side of the base 30.

The base 30 has a fifth main surface 351 and a sixth main surface 361 opposite to each other. The base 30 also has a fifth side surface (not shown) and a sixth side surface (not shown) opposite to each other.

The first resonating arm 10 is connected to the base 30. The first resonating arm 10 is approximately a parallelepiped. The first resonating arm 10 has a first main surface 111, a first side surface 112, a second main surface 121, and a second side surface 122 adjacent to each other in sequence. The first main surface 111 and the second main surface 121 are substantially parallel to each other. The first resonating arm 10 has one first groove 171 and two second groove 172. The first groove 171 is located on the first main surface 111, and the two second groove 172 are located on the second main surface 121. The two second groove 172 are substantially parallel to each other.

The second resonating arm 20 is also connected to the base 30. The second resonating arm 20 is approximately a parallelepiped. The second resonating arm 20 has a third main surface 231, a third side surface 232, a fourth main surface 241, and a fourth side surface 242 adjacent to each other in sequence. The third main surface 231 and the fourth main surface 241 are substantially parallel to each other. The second resonating arm 20 has one third groove 273 and two fourth groove 274. The third groove 273 is located on the third main surface 231, and the two fourth groove 274 are located on the fourth main surface 241. The two fourth groove 274 are substantially parallel to each other. The first resonating arm 10 and the second resonating arm 20 are approximately parallel to each other. Both resonating arms extend out along the Y' axis.

The first main surface 111 and the third main surface 231 are connected to the fifth main surface 351. The first main surface 111, the third main surface 231, and the fifth main surface 351 are substantially coplanar. The second main surface 121 and the fourth main surface 241 are connected to the sixth main surface 361. The second main surface 121, the fourth main surface 241, and the sixth main surface 361 are substantially coplanar.

Figure 12A:
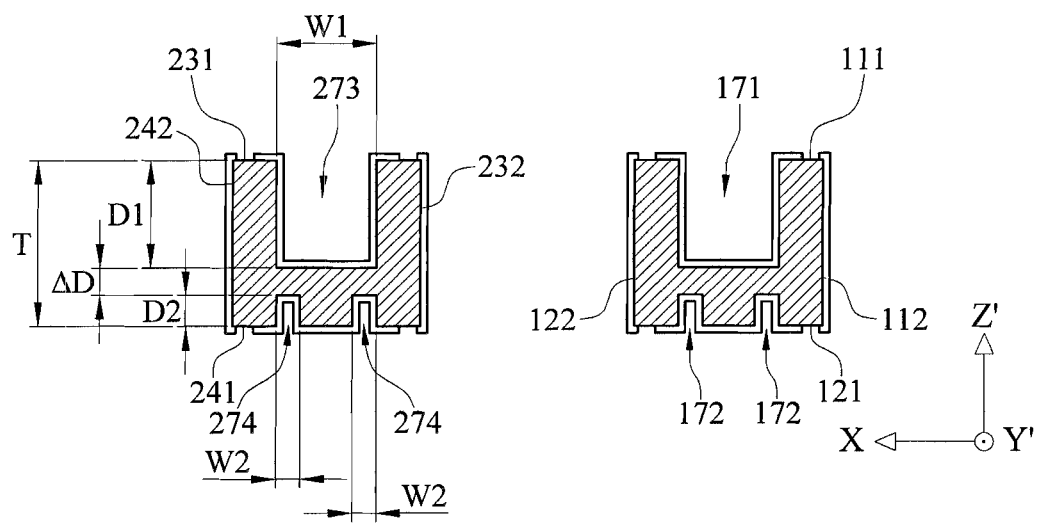
FIG. 12A is a cross-sectional view taken along Line 12A-12A of FIG. 11A.
Figure 12B:
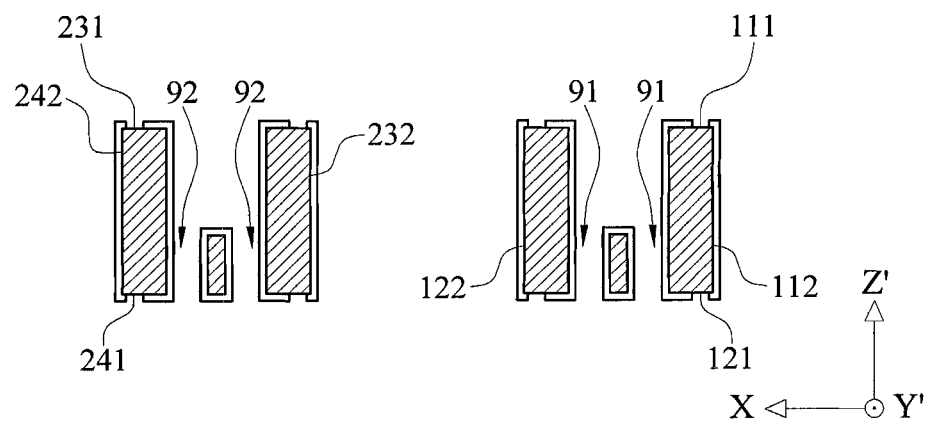
FIG. 12B is a cross-sectional view taken along Line 12B-12B of FIG. 11A.

FIG. 12A is a cross-sectional view taken along Line 12A-12A of FIG. 11A, and FIG. 12B is a cross-sectional view taken along Line 12B-12B of FIG. 11A. The widths of the two second groove 172 on the second main surface 121 are substantially the same, and the depths thereof are also substantially the same. The widths of the two fourth groove 274 on the fourth main surface 241 are substantially the same, and the depths thereof are also substantially the same. In this embodiment, the first width W1 is the width of the first groove 171 and the third groove 273. The second width W2 is the width of the second groove 172 and the fourth groove 274. The first depth D1 is the depth of the first groove 171 and the third groove 273. The second depth D2 is the depth of the second groove 172 and the fourth groove 274. Since the first width W1 is greater than the second width W2, the first depth D1 is greater than the second depth D2.

Refer to FIG. 11B. Viewing from the top of the second main surface 121, one of the two first via-hole 91 is partially embedded in the second groove 172 which is close to the first side surface 112, and the other first via-hole 91 is partially embedded in the other second groove 172 which is close to the second side surface 122. Viewing from the top of the fourth main surface 241, one of the two second via-hole 92 is partially embedded in the fourth groove 274 which is close to the third side surface 232, and the other second via-hole 92 is partially embedded in the other fourth groove 274 which is close to the fourth side surface 242. Refer to FIG. 11A. Viewing from the top of the first main surface 111, the two first via-hole 91 are separately embedded in the first groove 171, one near the first side surface 112 and the other near the second side surface 122. Viewing from the top of the third main surface 231, the two second via-hole 92 are separately embedded in the third groove 273, one near the third side surface 232 and the other near the fourth side surface 242.

Figure 13:
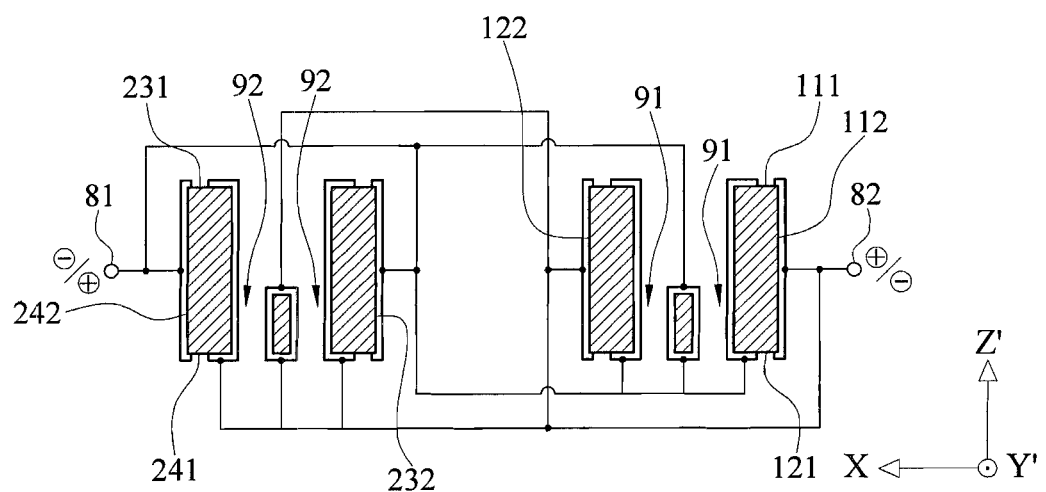
FIG. 13 is a schematic view of an electrical connection relation of FIG. 12B.
Figure 14:
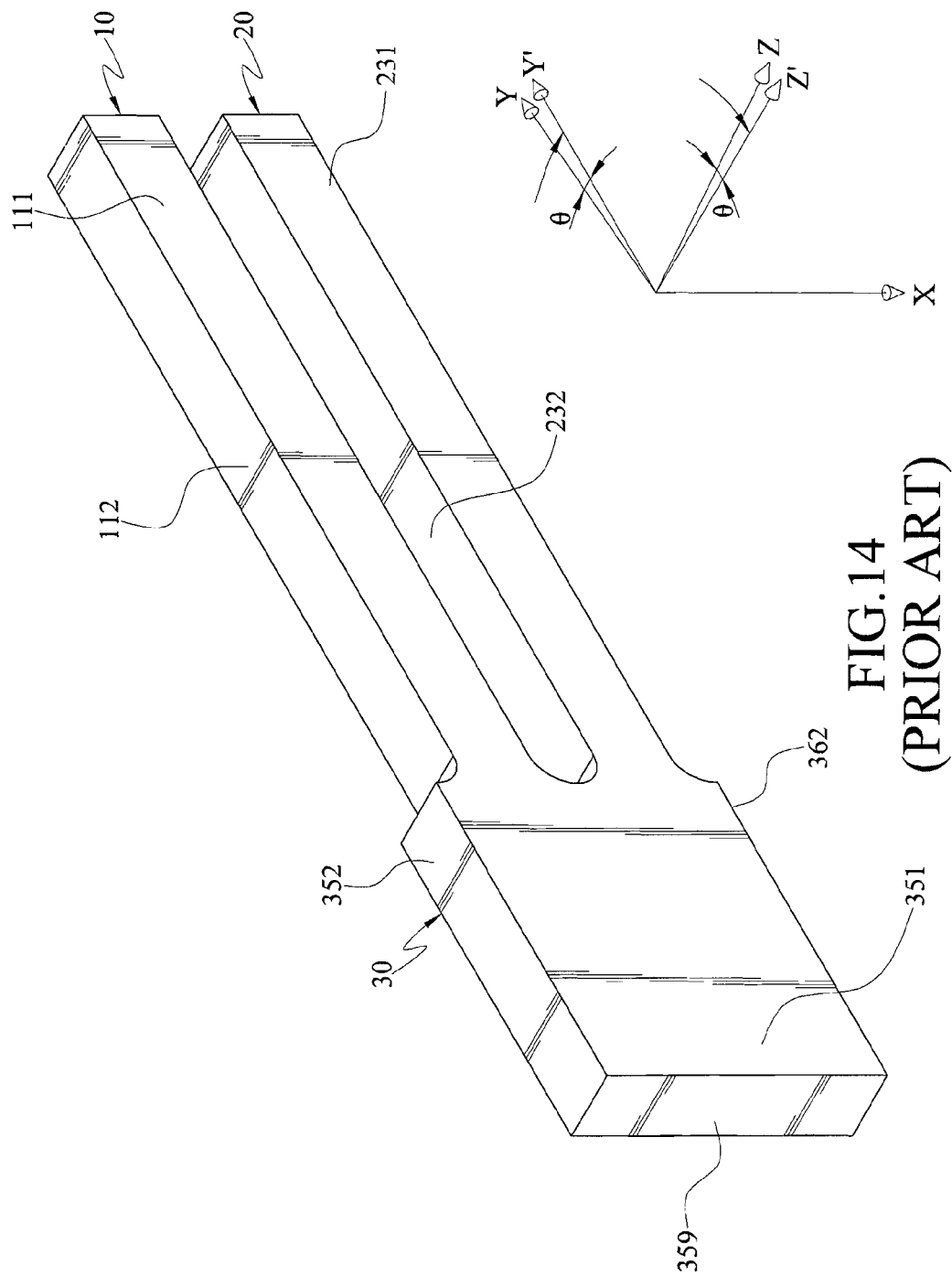
FIG. 14 is a diagram of a relative relation between X, Y, and Z axial directions of a single crystal alpha quartz bar and X, Y', and Z' axial directions of a tuning fork quartz crystal resonator in the prior art.
Figure 15:
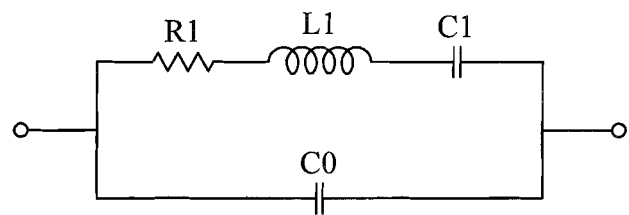
FIG. 15 is a diagram of an equivalent circuit of the quartz crystal resonator in the prior art.

FIG. 13 illustrates the electrical interconnection of the electrodes shown on FIG. 12B. The metal film on the surface of the first groove 171, the metal film on the surface of the two second groove 172, the metal film on the surface of the two first via-hole 91, the metal film on the third side surface 232, and the metal film on the fourth side surface 242 are electrically connected to form a first electrode 81. The metal film on the surface of the third groove 273, the metal film on the surface of the two fourth groove 274, the metal film on the surface of the two second via-hole 92, the metal film on the first side surface 112, and the metal film on the second side surface 122 are electrically connected to form a second electrode 82.

In summary, the tuning fork quartz crystal resonator of the present invention has the asymmetric grooves 171, 172, 273, and 274, via-holes 91 and 92 for reliable electrode connection, the concaves 95 in the form of continuous curved surfaces, and the recess 39, thereby achieving the effects of lowering the R1 value and improving the Q value of the resonator, alleviating the vibration impact, and also simplifying the manufacturing process.

What is claimed is:

1. A tuning fork quartz crystal resonator, comprising:
a base having two generally planar main surfaces opposite to each other, and two side surfaces opposite to each other;
a first resonating arm connecting to one side of the base; and
a second resonating arm connecting to the same side of the base;
wherein a recess is formed on one of the main surfaces and does not completely pass through the base, the recess keeps a distance from each end and each side surface of the base, the recess is sized and configured such that a first width near the first resonating arm and the second resonating arm is greater than a second width away from the first resonating arm and the second resonating arm.

2. The tuning fork quartz crystal resonator according to claim 1, wherein the recess is a polygon having an arc chord angle on each vertex.

* * * * *